US 8,748,951 B2

(12) United States Patent
Korekado et al.

(10) Patent No.: US 8,748,951 B2
(45) Date of Patent: Jun. 10, 2014

(54) SOLID-STATE IMAGE SENSING DEVICE

(75) Inventors: Keisuke Korekado, Wako (JP);
Tomoyuki Kamiyama, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 13 days.

(21) Appl. No.: 13/435,368

(22) Filed: Mar. 30, 2012

(65) Prior Publication Data

US 2012/0248514 A1 Oct. 4, 2012

(30) Foreign Application Priority Data

Mar. 31, 2011 (JP) ................................ 2011-081325

(51) Int. Cl.
*H01L 31/06* (2012.01)
(52) U.S. Cl.
USPC ........................................ 257/291; 257/443
(58) Field of Classification Search
USPC ......... 257/291, 292, 293, 428, 431, 443, 458, 257/461, 462, 80–87, 184, 187, 202, 204, 257/205; 438/24, 48, 54, 57, 73; 327/82
See application file for complete search history.

(56) References Cited

U.S. PATENT DOCUMENTS

| | | | |
|---|---|---|---|
| 5,804,868 A | 9/1998 | Kobayashi et al. | |
| 7,683,954 B2 * | 3/2010 | Ichikawa et al. | 348/308 |
| 7,843,029 B2 * | 11/2010 | Kawahito et al. | 257/461 |
| 7,876,422 B2 * | 1/2011 | Hashimoto et al. | 356/4.07 |
| 7,910,964 B2 * | 3/2011 | Kawahito et al. | 257/292 |
| 8,284,282 B2 | 10/2012 | Oike | |
| 2007/0158770 A1 * | 7/2007 | Kawahito | 257/431 |
| 2008/0042047 A1 * | 2/2008 | Nam et al. | 250/208.1 |
| 2009/0230437 A1 | 9/2009 | Kawahito et al. | |
| 2009/0251582 A1 | 10/2009 | Oike | |
| 2009/0303362 A1 | 12/2009 | Ebihara | |
| 2010/0231891 A1 * | 9/2010 | Mase et al. | 356/5.01 |
| 2011/0019049 A1 * | 1/2011 | Jin et al. | 348/308 |
| 2011/0157354 A1 | 6/2011 | Kawahito | |

FOREIGN PATENT DOCUMENTS

| | | |
|---|---|---|
| JP | 2009-268083 A | 11/2009 |
| JP | 2009-296400 A | 12/2009 |
| JP | 2010-32425 A | 2/2010 |
| JP | 2010-268079 A | 11/2010 |
| WO | WO2007/026777 A1 | 3/2007 |

OTHER PUBLICATIONS

Ryohei Miyagawa et al, "Integration-Time Based Computational Image Sensors," ITE Technical Report vol. 19, No. 65, Nov. 1995, pp. 37-41.
Ryohei Miyagawa et al, "CCD-Based Range-Finding Sensor," IEEE Transactions on Electron Devices, vol. 44, No. 10, Oct. 1997, pp. 1648-1652.
U.S. Office Action, U.S. Appl. No. 12/435,496, dated Feb. 1, 2013.

* cited by examiner

*Primary Examiner* — Fernando L Toledo
*Assistant Examiner* — Christine C Lau
(74) *Attorney, Agent, or Firm* — Squire Sanders (US) LLP

(57) ABSTRACT

A solid-state image sensing device has a unit pixel containing a photoelectric conversion element for detecting a light to generate photoelectrons and pixel drive circuits for driving the unit pixel. The photoelectric conversion element has a photogate structure, and the pixel drive circuits apply a voltage selected from three voltages to the photogate of the photoelectric conversion element to generate or transfer the photoelectrons. The three voltages include at least a first voltage, a second voltage higher than the first voltage, and a third voltage higher than the first voltage and lower than the second voltage.

8 Claims, 19 Drawing Sheets

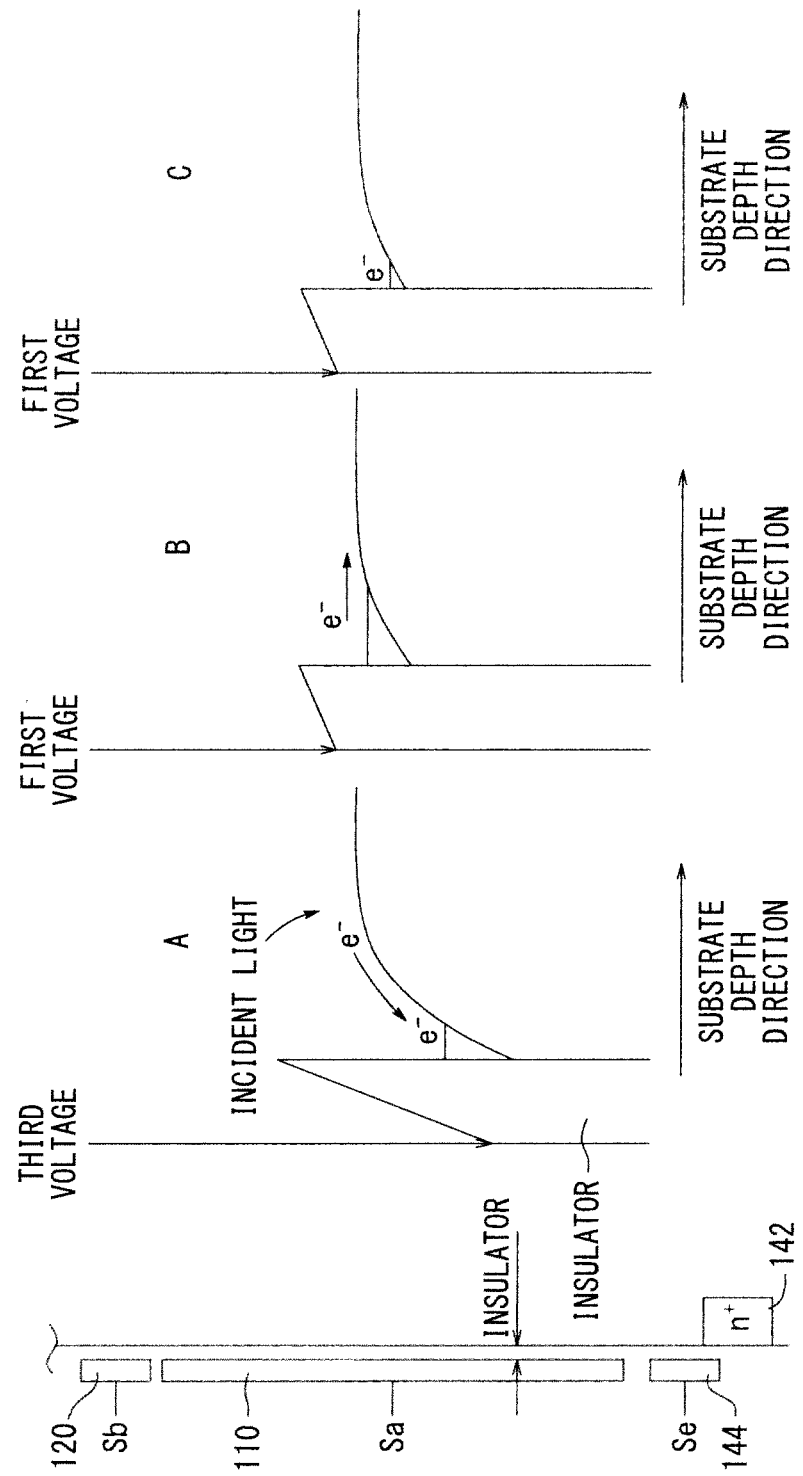

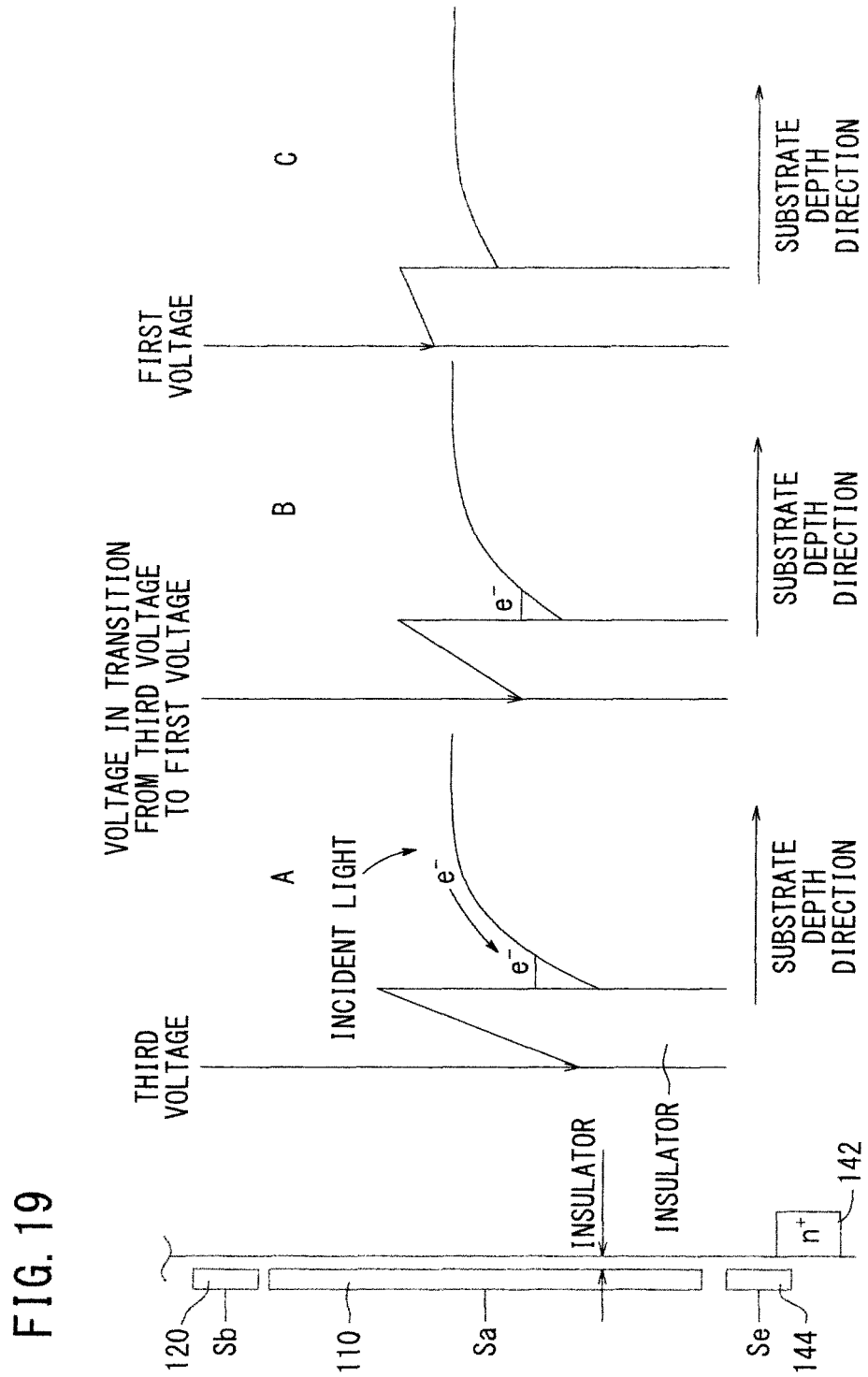

SOLID-STATE IMAGE SENSING DEVICE

CROSS-REFERENCE TO RELATED APPLICATION

This application is based upon and claims the benefit of priority from Japanese Patent Application No. 2011-081325 filed on Mar. 31, 2011, of which the contents are incorporated herein by reference.

BACKGROUND OF THE INVENTION

1. Field of the Invention

The present invention relates to an improvement in efficiency of receiving and transferring photoelectrons generated in a photoelectric conversion element of a solid-state image sensing device.

2. Description of the Related Art

Known conventional applications of solid-state image sensing devices include technologies using a time-of-flight (TOF) method for measuring a distance to a target object in a contactless manner. In one known technology using the TOF method, photoelectrons generated in one photoelectric conversion element are allocated to, accumulated in, and read from a plurality of photoelectron hold units. In Ryohei Miyagawa and Takeo Kanade, "*CCD-Based Range-Finding Sensor*", *IEEE Transactions on Electron Devices*, Vol. 44, No. 10, October 1997, pp. 1648-1652 and Ryohei Miyagawa and Takeo Kanade, *ITE Technical*, Vol. 19, No. 65, pp. 37-41 (November 1995), a pulsed light is emitted from a light-emitting device in an emission period and is not emitted therefrom in an emission stop period, the light-emitting device is driven at a duty ratio of 50% while repeating the emission period and the emission stop period with the same time length, the shutter of the photoelectric conversion element is controlled in synchronism with the emission period and the emission stop period, and thus generated photoelectrons are distributed in two directions. The distance to the target object is measured using the photoelectrons distributed in the two directions. In addition, in Japanese Laid-Open Patent Publication No. 2010-032425, the photoelectrons generated in the photoelectric conversion element are distributed in four directions.

SUMMARY OF THE INVENTION

However, in principle, in the TOF method, it is necessary to detect the time delay between the timing at which the light is emitted from the light-emitting device and the timing at which the emitted light returns to the solid-state image sensing device after reflected by the object. Since the light propagates at a very high speed, a technology for distributing the photoelectrons generated in the photoelectric conversion element at a high speed corresponding to the light speed, thereby obtaining only useful information (photoelectrons), is important for achieving an accurate distance measurement result.

Accordingly, in view of the above conventional problem, an object of the present invention is to provide a solid-state image sensing device capable of reducing residual photoelectrons remaining in a photoelectric conversion element in the process of transferring the photoelectrons and improving the efficiency of receiving the photoelectrons useful for achieving an accurate distance measurement result.

To achieve the above object, there is provided a solid-state image sensing device comprising a unit pixel containing a photoelectric conversion element for detecting a light to generate photoelectrons and pixel drive circuits for driving the unit pixel, wherein the photoelectric conversion element has a photogate structure, the pixel drive circuits apply a voltage selected from three voltages to a photogate of the photoelectric conversion element to store or transfer the photoelectrons, and the three voltages include at least a first voltage, a second voltage higher than the first voltage, and a third voltage higher than the first voltage and lower than the second voltage.

The pixel drive circuits may apply the third voltage to the photogate to discharge the photoelectrons generated in the photoelectric conversion element in a discharge period.

The unit pixel may further contain a third transfer unit for transferring the photoelectrons generated in the photoelectric conversion element to a diffusion layer to discharge the photoelectrons, and the pixel drive circuits may turn on the third transfer unit to transfer the photoelectrons to the diffusion layer in the discharge period.

After the discharge period, the pixel drive circuits may apply the second voltage or the third voltage to the photogate to store the photoelectrons generated in the photoelectric conversion element in a storage period for storing the photoelectron generated in the photoelectric conversion element.

After the storage period, the pixel drive circuits may apply the third voltage to the photogate and then apply to the first voltage to the photogate in this order to transfer the photoelectrons stored in the photoelectric conversion element to a photoelectron hold unit in a first transfer period.

The unit pixel may further contain a first transfer unit for transferring the photoelectrons generated in the photoelectric conversion element to the photoelectron hold unit, the photoelectrons being repeatedly collected, held, and accumulated in the photoelectron hold unit, and the pixel drive circuits may turn on the first transfer unit to transfer the photoelectrons to the photoelectron hold unit in only the first transfer period or both the storage period and the first transfer period and may turn off the first transfer unit not to transfer the photoelectrons to the photoelectron hold unit in a period other than the first transfer period or than the storage period and the first transfer period.

The pixel drive circuits may apply the second voltage, the third voltage, and the first voltage to the photogate in this order to discharge the photoelectrons remaining in the photoelectric conversion element in a pre-discharge (last discharge) period after the discharge period and just before the storage period.

The pixel drive circuits may contain a first switch for applying the first voltage to the photogate, a second switch for applying the second voltage to the photogate, and a third switch for applying the third voltage to the photogate, and the photoelectrons generated in the photoelectric conversion element may be discharged, stored, transferred, or held by controlling the on/off states of the first switch, the second switch, and the third switch.

The first switch may have a plurality of MOS transistors connected in parallel, and the pixel drive circuits may select the number of the MOS transistors to be turned on, whereby a resistance value of the first switch may be changed to control a time required to change the voltage applied on the photogate from the third voltage or the second voltage to the first voltage.

The on/off state of at least one of the MOS transistors is controlled by a logic circuit using a first signal input as an ON/OFF control signal and using a second signal input as a setting signal for changing the resistance value of the first switch.

In the present invention, in the process of transferring the photoelectrons generated in the photoelectric conversion element, the amount of the residual photoelectrons remaining in the photoelectric conversion element can be reduced. In addition, the efficiency of receiving the photoelectrons useful for achieving the accurate distance measurement result can be improved.

The pixel drive circuits can apply the third voltage to the photogate to discharge the photoelectrons generated in the photoelectric conversion element in the discharge period. Therefore, the photoelectrons can be efficiently discharged.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 18 is a potential diagram of the substrate surface of the photoelectric conversion element in the depth direction at each timing shown in the time chart of FIG. 17, where a voltage signal applied to the photogate is instantly switched from the third voltage to the first voltage; and FIG. 19 is a potential diagram of the substrate surface of the photoelectric conversion element in the depth direction at each timing shown in the time chart of FIG. 17, where the resistance value of the first switch is changed according to Modified Example 2.

DESCRIPTION OF THE PREFERRED EMBODIMENTS

Figure 1:
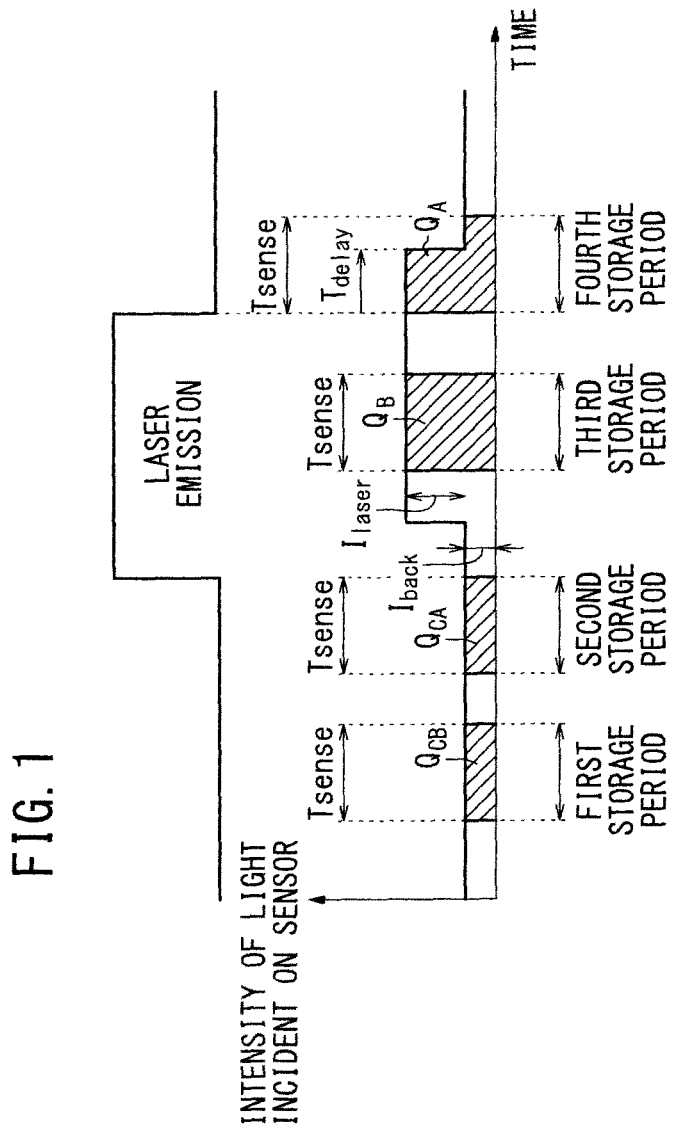
FIG. 1 is a view for illustrating the TOF principle.

A solid-state image sensing device having a unit pixel according to a preferred embodiment of the present invention will be described in detail below with reference to the accompanying drawings.

First an example of the TOF principle will be briefly described with reference to FIG. 1. In first and second storage periods, an irradiation unit (not shown) does not emit a light such as a laser light to an object, and only an ambient light is stored for a certain time ($T_{sense}$). In each unit pixel, photoelectrons are generated in a light receiving device via photoelectric conversion of the incident light in the first and second storage periods, and then are introduced into a plurality of photoelectron hold units. $Q_{CB}$ represents the electric charge amount of the photoelectrons that are generated by the light incident on the light receiving device in the first storage period and then introduced into the photoelectron hold units. $Q_{CA}$ represents the electric charge amount of the photoelectrons that are generated by the light incident on the light receiving device in the second storage period and then introduced into the photoelectron hold units.

All or part of third and fourth storage periods overlap with the period in which a reflected light of the light emitted from the irradiation unit is incident on the light receiving device. In each unit pixel, photoelectrons are generated also in the third and fourth storage periods, and then are introduced into the photoelectron hold units. In this example, in the third storage period, the unit pixel constantly receives the reflected light of the light emitted from the irradiation unit, and the reflected light and the ambient light are stored for a certain time ($T_{sense}$). In the fourth storage period, the lights are stored for a certain time ($T_{sense}$) after the light emission from the irradiation unit is stopped. Also the photoelectrons generated in the third and fourth storage periods are introduced into the photoelectron hold units. $Q_B$ represents the electric charge amount of the photoelectrons that are generated by the lights incident on the light receiving device in the third storage period and then introduced into the photoelectron hold units. $Q_A$ represents the electric charge amount of the photoelectrons that are generated by the lights incident on the light receiving device in the fourth storage period and then introduced into the photoelectron hold units. $I_{laser}$ represents the intensity of the reflected light of the emitted light, and $I_{back}$ represents the intensity of the ambient light.

Thus, the relations of $Q_A - Q_{CA} \propto I_{laser} \times T_{delay}$ and $Q_B - Q_{CB} \propto I_{laser} \times T_{sense}$ are satisfied, in which $T_{delay}$ represents the time elapsed until the emitted light is reflected by the object and returns.

The above relations can be converted to the expression of $T_{delay} = T_{sense} \times (Q_A - Q_{CA})/(Q_B - Q_{CB})$. Therefore, the distance Z to the object can be obtained using the expression of $Z = c \times T_{delay}/2 = c \times T_{sense} \times (Q_A - Q_{CA})/(2(Q_B - Q_{CB}))$, in which c represents the light speed.

Figure 2:
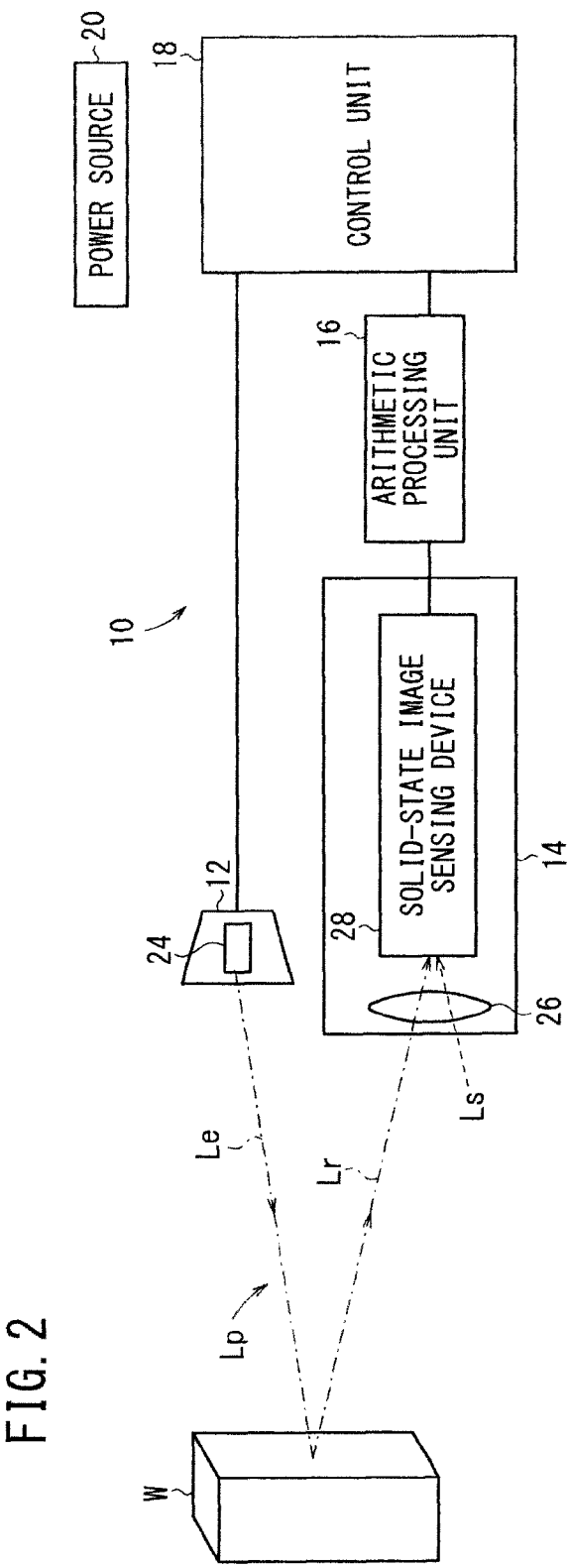
FIG. 2 is a schematic structural view of a distance measuring system using a solid-state image sensing device according to an embodiment.

FIG. 2 is a schematic structural view of a distance measuring system 10 using a solid-state image sensing device according to the embodiment. As shown in FIG. 2, the distance measuring system 10 has an irradiation unit 12, an image capturing unit 14, an arithmetic processing unit 16, a control unit 18, and a power source 20.

The power source 20 is for supplying a predetermined power-supply voltage to each portion of the distance measuring system 10. For the sake of brevity, power source lines extending from the power source 20 to the units are omitted in FIG. 2.

The irradiation unit 12 acts to emit a pulsed light Lp to a target object W, and has a light emitter 24 that outputs the pulsed light Lp under control of the control unit 18. In the distance measuring system 10, the light emitter 24 in the irradiation unit 12 may be formed such that semiconductor laser bars having linearly arranged light-emitting spots (emitters) are stacked (connected in series) to perform surface emission.

The light emitter 24 emits an infrared light. For example, the light emitter 24 can emit an infrared light having a wavelength of 870 nanometers (nm) at an output level of 100 watts (W). The light emitter 24 emits the pulsed light Lp with an output time (pulse duration) of 100 nanoseconds.

The light emitter 24 may have a plurality of light-emitting spots arranged in a linear array or a matrix. Another light-emitting device such as a laser diode or a light-emitting diode (LED) may be used as the light emitter 24.

In the distance measuring system 10, the pulsed light Lp emitted from the irradiation unit 12 is reflected by the target object W and then incident on the image capturing unit 14. For illustrative purposes, the pulsed light Lp between the irradiation unit 12 and the target object W is referred to as the emitted light Le, and the pulsed light Lp between the target object W and the image capturing unit 14 is referred to as the reflected light Lr.

The image capturing unit 14 has a lens 26 and a solid-state image sensing device 28. The reflected light Lr and the ambient light Ls pass through the lens 26, and are collected and detected in the solid-state image sensing device 28. The solid-state image sensing device 28 is sensitive to the ambient light Ls and the pulsed light Lp emitted from the irradiation unit 12. In the arithmetic processing unit 16, the distance to the target object W is calculated in the manner described for FIG. 1 based on the information on the electric charge amounts of the photoelectrons stored in the solid-state image sensing device 28 in the storage periods.

Figure 3:
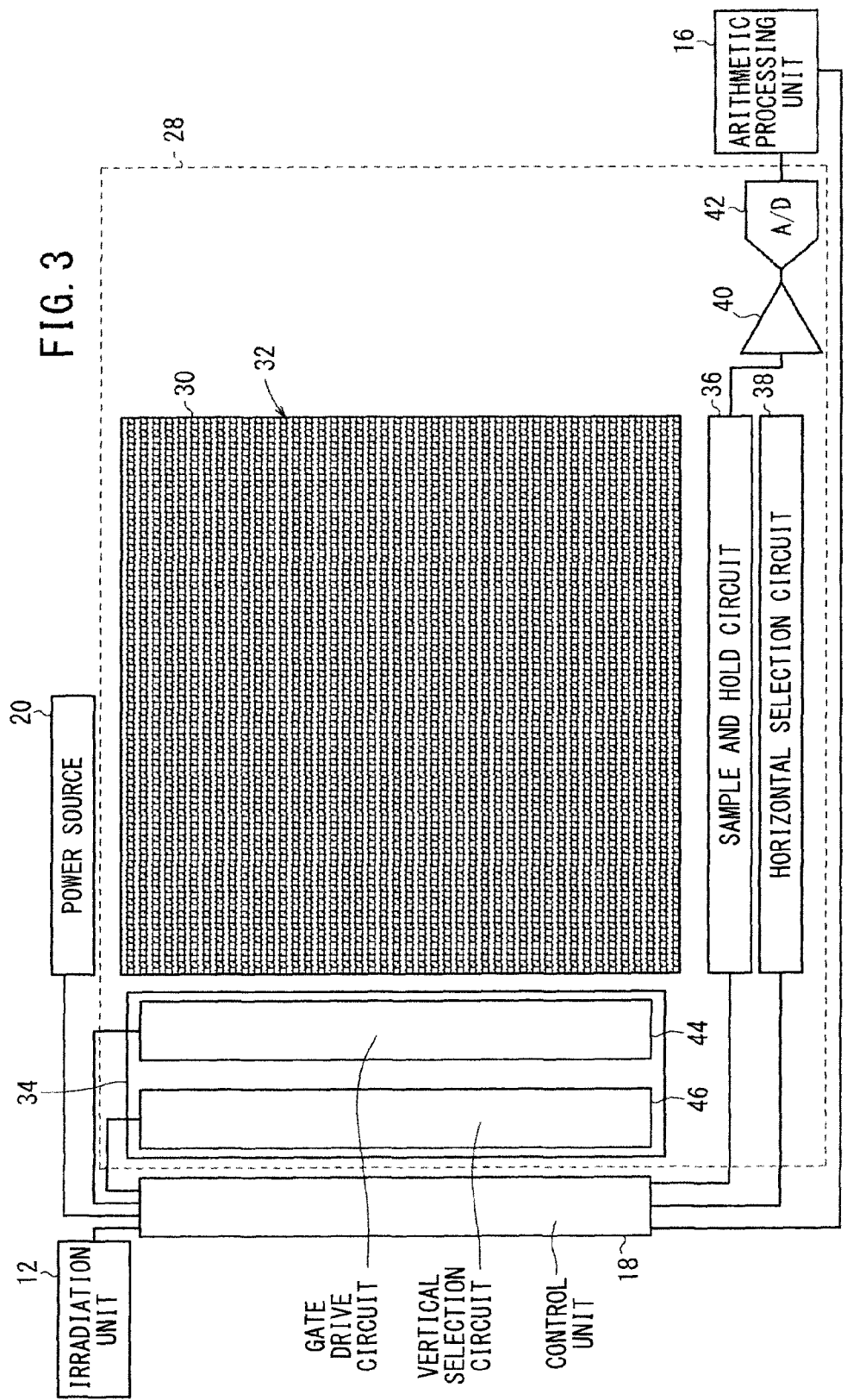
FIG. 3 is a structural view of the solid-state image sensing device.

FIG. 3 is a structural view of the solid-state image sensing device 28. The solid-state image sensing device 28 has a pixel array 32 containing a matrix of unit pixels 30, a pixel drive circuits (pixel drivers) 34, a sample and hold circuit 36 for reading out a pixel output signal, a horizontal selection circuit 38, an output buffer 40, and an A/D converter 42.

The power source 20 applies a positive power-supply voltage Vdd and a resetting voltage Vref to the pixel array 32. The pixel drive circuit 34 has a gate drive circuit 44 and a vertical selection circuit 46. The gate drive circuit 44 outputs various gate drive signal voltages (pixel drive signal voltages), e.g. to generate (store), hold, transfer, and discharge the photoelectrons in each unit pixel 30 in the pixel array 32. The vertical selection circuit 46 has a multiplexer (not shown), selects a row containing a unit pixel 30 to be read, and makes the unit pixel 30 output a voltage signal (pixel signal) corresponding to the held photoelectrons. The horizontal selection circuit 38 has another multiplexer (not shown) and selects a column containing the unit pixel 30 to be read. The read pixel signal is held in the sample and hold circuit 36 and then output through the output buffer 40 and the A/D converter 42 to the arithmetic processing unit 16. The control unit 18 and the arithmetic processing unit 16 may be mounted in the solid-state image sensing device 28.

Figure 4:
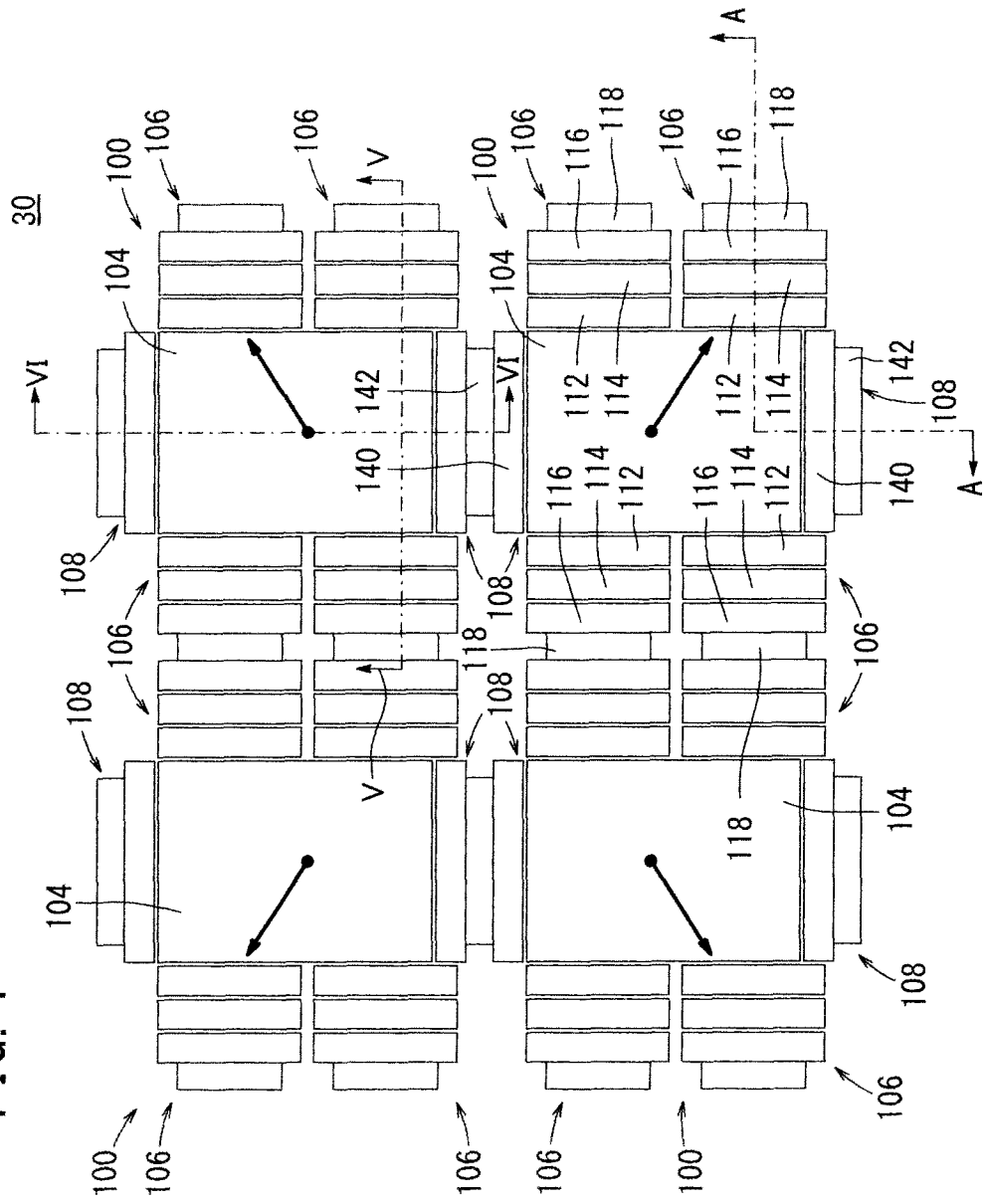
FIG. 4 is a plan view of one unit pixel in the solid-state image sensing device of FIG. 3.
Figure 5:
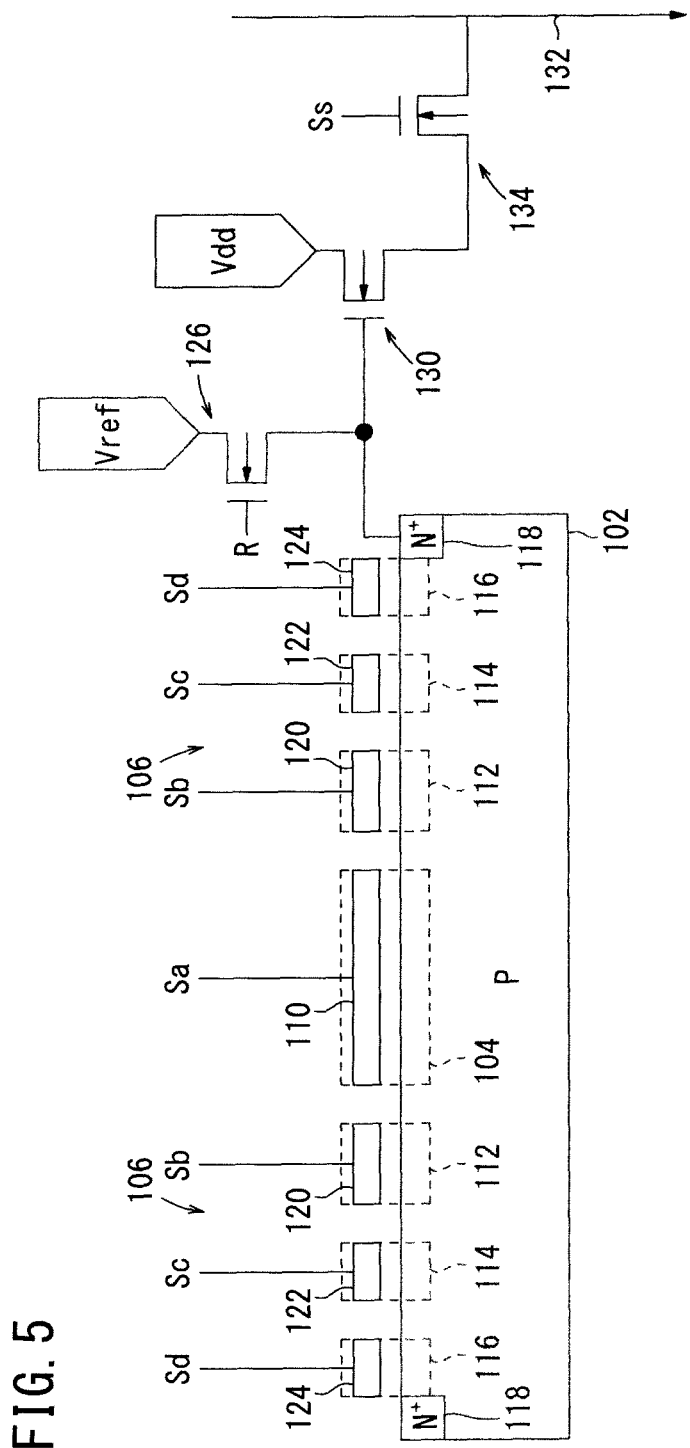
FIG. 5 is a cross-sectional view taken along the line V-V in the direction of the arrows in FIG. 4.
Figure 6:
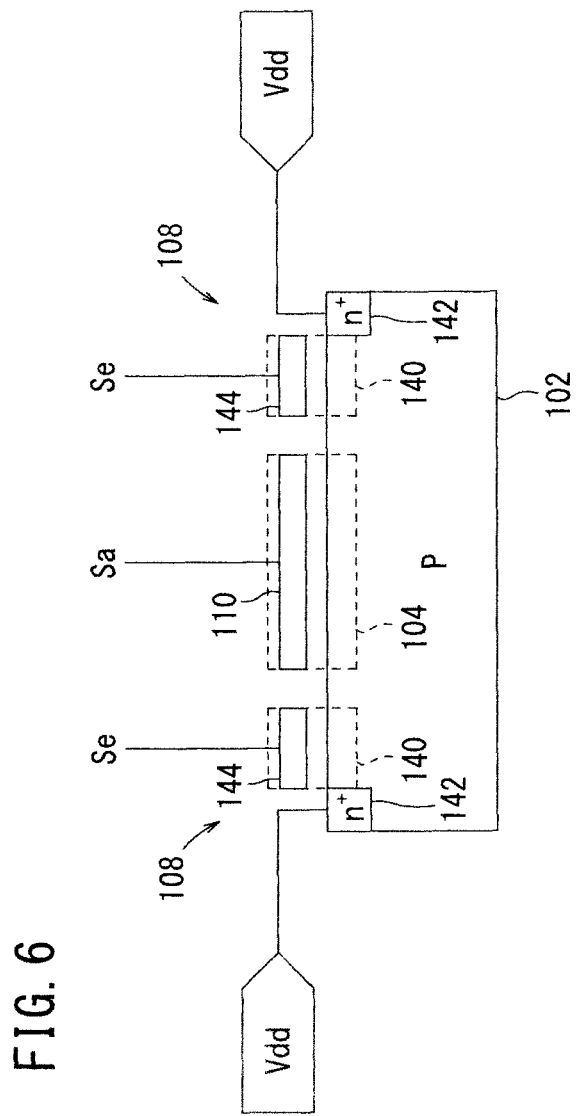
FIG. 6 is a cross-sectional view taken along the line VI-VI in the direction of the arrows in FIG. 4.

FIG. 4 is a plan view of one unit pixel 30 in the solid-state image sensing device 28 of FIG. 3. The unit pixel 30 has a plurality of light receiving devices 100. In this embodiment, the unit pixel 30 has four light receiving devices 100 arranged in a matrix. FIGS. 5 and 6 are cross-sectional views of the light receiving device 100 of FIG. 4. More specifically, FIG. 5 is a cross-sectional view taken along the line A-A in the direction of the arrows in FIG. 4, and FIG. 6 is a cross-sectional view taken along the line VI-VI in the direction of the arrows in FIG. 4.

The light receiving device 100 has a p-type (first-conductivity-type) semiconductor substrate 102, and thereon a photoelectric conversion element 104, four photoelectron distributors 106, and two photoelectron dischargers 108. The photoelectric conversion element 104 has a photogate structure containing an electrode (hereinafter referred to as photogate) 110, which is formed on the p-type semiconductor substrate 102 with an insulator (not shown) interposed therebetween. The photoelectric conversion element 104 is a photodiode capable of detecting a light and generating photoelectrons or negative electric charge (converting the detected light to the photoelectrons). A gate drive signal Sa for driving the photoelectric conversion element 104 is applied to the photogate 110 by the gate drive circuit 44.

The photoelectron distributor 106 has a first transfer unit 112, a photoelectron hold unit 114, a second transfer unit 116, and a floating diffusion layer 118. The first transfer unit 112 has an MOS diode structure containing an electrode (first transfer gate) 120, which is formed on the p-type semiconductor substrate 102 with the insulator interposed therebetween, for allocating and transferring the photoelectrons generated in the photoelectric conversion element 104 to the photoelectron hold unit 114 (see FIG. 5). A gate drive signal Sb for driving the first transfer unit 112 is input from the gate drive circuit 44 to the first transfer gate 120. The photoelectron hold unit 114 is located on one side of the photoelectric conversion element 104 with the first transfer unit 112 interposed therebetween and has an MOS diode structure containing an electrode (hold gate) 122, which is formed on the p-type semiconductor substrate 102 with the insulator interposed therebetween, for temporarily collecting and holding the photoelectrons generated in the photoelectric conversion element 104 (see FIG. 5). A gate drive signal Sc for driving the photoelectron hold unit 114 is input from the gate drive circuit 44 to the hold gate 122.

The second transfer unit 116 is located on one side of the first transfer unit 112 with the photoelectron hold unit 114 interposed therebetween and has an MOS diode structure containing an electrode (second transfer gate) 124, which is formed on the p-type semiconductor substrate 102 with the insulator interposed therebetween, for transferring the photoelectrons stored in the photoelectron hold unit 114 (see FIG. 5). A gate drive signal Sd for driving the second transfer unit 116 is applied from the gate drive circuit 44 to the second transfer gate 124. The floating diffusion (FD) layer 118 is located on one side of the photoelectron hold unit 114 with the second transfer unit 116 interposed therebetween for taking in the photoelectrons transferred from the photoelectron hold unit 114 and converting the photoelectrons to a voltage. The floating diffusion layer 118 is formed such that an n-type (second-conductivity-type) impurity is disposed on the p-type semiconductor substrate 102.

As shown in FIG. 4, in one light receiving device 100, each two of the four photoelectron distributors 106 are arranged in the horizontal direction (the right-left direction) symmetrically with respect to the photoelectric conversion element 104. Thus, two of the four photoelectron distributors 106 are arranged vertically on each of the right and left sides of the photoelectric conversion element 104. In one unit pixel 30, the light receiving devices 100 adjacent to each other in the horizontal direction share two floating diffusion layers 118 formed therebetween. Thus, some of the floating diffusion layers 118 are shared by the light receiving devices 100.

As shown in FIG. 5, the floating diffusion layer 118 is connected to a reset transistor 126 for resetting the potential of the floating diffusion layer 118 to a reference potential. The floating diffusion layer 118 is connected to the source of the reset transistor 126, the resetting voltage Vref is applied from the power source 20 to the drain, and a resetting signal R is supplied from the gate drive circuit 44 to the gate. When a high resetting signal R is supplied to the gate of the reset transistor 126, the reset transistor 126 is turned on to reset the potential of the floating diffusion layer 118 to the reference potential.

Further, the floating diffusion layer 118 is connected to a signal read transistor 130 for reading a voltage signal corresponding to the photoelectrons stored in the floating diffusion layer 118. The signal read transistor 130 is connected to a selection transistor 134 for selecting whether the voltage signal read by the signal read transistor 130 is output or not to a signal read line 132. The power-supply voltage Vdd is applied from the power source 20 to the drain of the signal read transistor 130, the gate is connected to the floating diffusion layer 118, and the source is connected to the drain of the selection transistor 134. When a high selection signal Ss is supplied from the vertical selection circuit 46 to the selection transistor 134, the selection transistor 134 is turned on to read from the signal read line 132 a voltage corresponding to the photoelectrons stored in the floating diffusion layer 118. The source of the selection transistor 134 is connected to the signal read line 132.

The photoelectron discharger 108 has a third transfer unit 140 and a diffusion layer 142. The third transfer unit 140 has an MOS diode structure containing an electrode (third transfer gate) 144, which is formed on the p-type semiconductor substrate 102 with the insulator interposed therebetween, for transferring the photoelectrons generated in the photoelectric conversion element 104 to the diffusion layer 142 (see FIG. 6).

The diffusion layer 142 is located on one side of the photoelectric conversion element 104 with the third transfer unit 140 interposed therebetween. The power-supply voltage Vdd is applied from the power source 20 to the diffusion layer 142. When a discharge signal Se is input from the gate drive circuit 44 to the third transfer gate 144, the photoelectrons generated in the photoelectric conversion element 104 are discharged from the diffusion layer 142 through the third transfer unit 140.

As shown in FIG. 4, in one light receiving device 100, the two photoelectron dischargers 108 are arranged in the vertical direction (the up-down direction) symmetrically with respect to the photoelectric conversion element 104. In one unit pixel 30, the light receiving devices 100 adjacent to each other in the vertical direction share the diffusion layer 142 formed therebetween. Thus, some of the diffusion layers 142 are shared by the light receiving devices 100.

Figure 7:
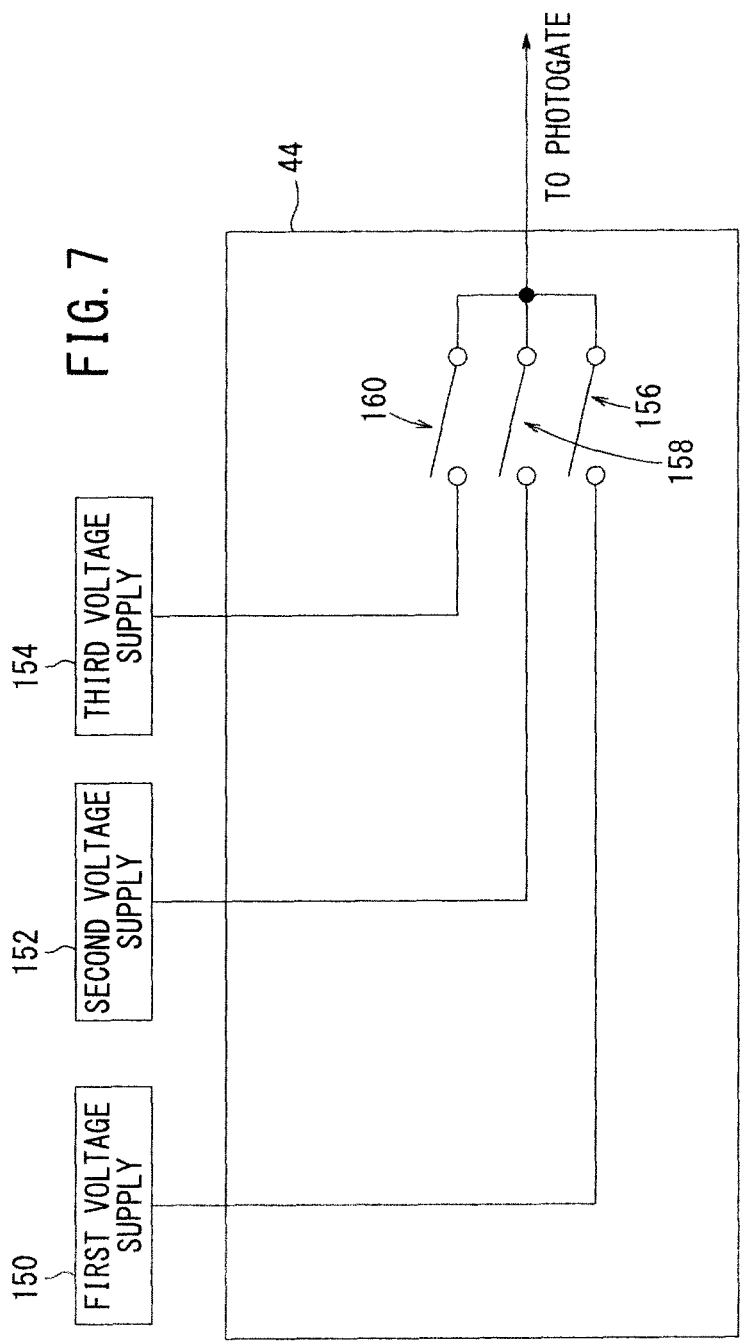
FIG. 7 is a structural view of a gate drive circuit shown in FIG. 3.

FIG. 7 is a structural view of the gate drive circuit 44. A first voltage supply 150 supplies the gate drive signal Sa of a first voltage, a second voltage supply 152 supplies the gate drive signal Sa of a second voltage, and a third voltage supply 154 supplies the gate drive signal Sa of a third voltage, to the photogate 110 of the photoelectric conversion element 104 in the unit pixel 30 of the pixel array 32. The first voltage supply 150 applies a reference voltage (e.g. 0 V) to the photogate 110, and is a ground in this embodiment. The second voltage supply 152 applies the second voltage higher than the first voltage to the photogate 110, and is mounted in the power source 20 in this embodiment. The third voltage supply 154 applies the intermediate third voltage higher than the first voltage and lower than the second voltage to the photogate 110, and is mounted in the power source 20 in this embodiment.

The gate drive circuit 44 has a first switch 156, a second switch 158, and a third switch 160 for switching a voltage applied to the photoelectric conversion element. When the first switch 156, the second switch 158, or the third switch 160 is turned on, the gate drive signal Sa of the first, second, or third voltage is selectively applied to the photogate 110. The first switch 156 is used for selecting whether the gate drive signal Sa of the first voltage is applied or not to the photogate 110, the second switch 158 is used for selecting whether the gate drive signal Sa of the second voltage is applied or not to the photogate 110, and the third switch 160 is used for selecting whether the gate drive signal Sa of the third voltage is applied or not to the photogate 110.

The photoelectric conversion element 104 is operated by selectively applying (supplying) the first, second, or third voltage to the photogate 110.

The gate drive circuit 44 functions also to apply the gate drive signals (voltages) Sb, Sc, Sd, and Se and the resetting signal (voltage) R to the first transfer gate 120, the hold gate 122, the second transfer gate 124, the third transfer gate 144, and the gate of the reset transistor 126.

Figure 8:
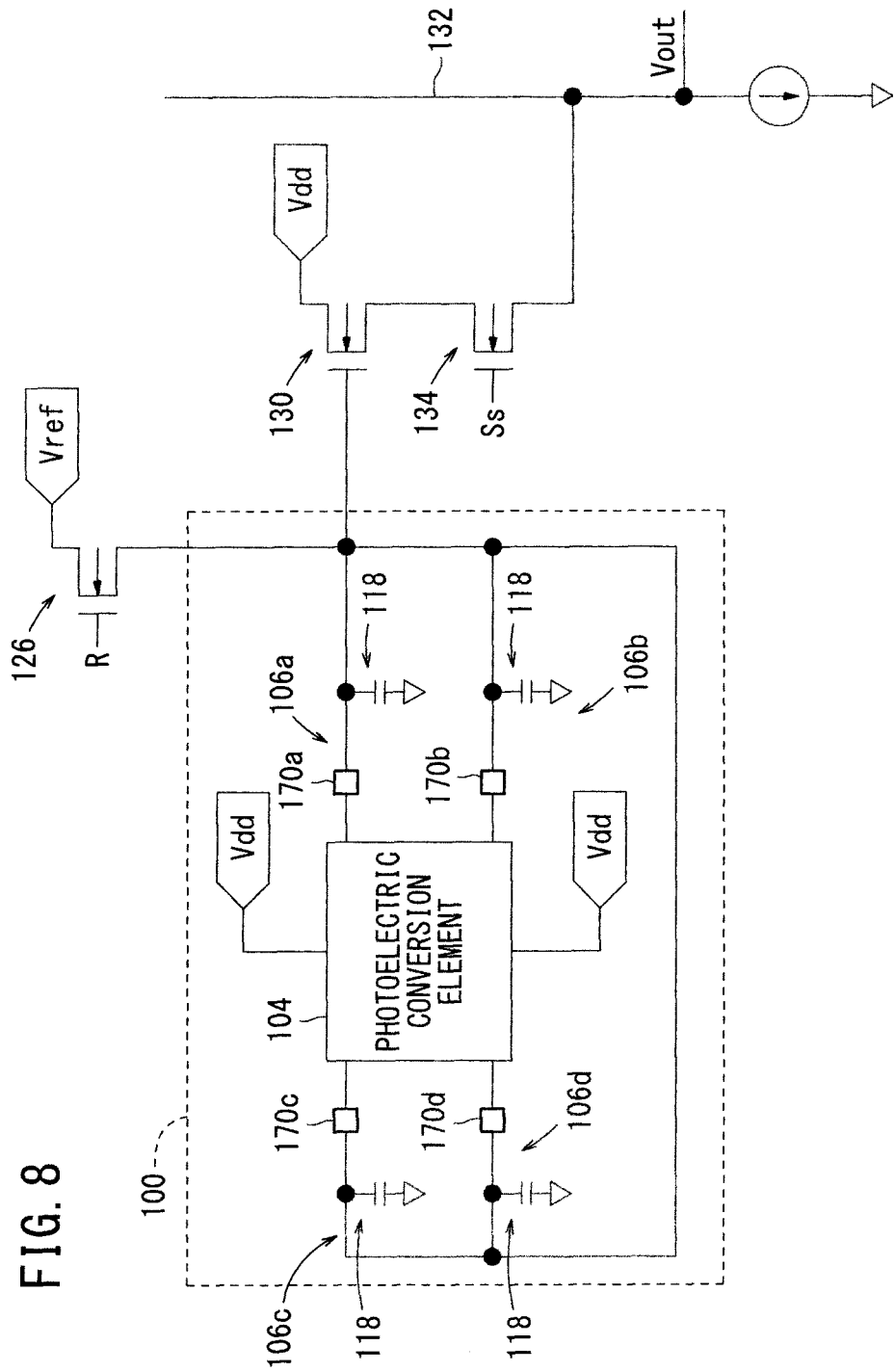
FIG. 8 is a view of a circuit structure of the unit pixel.

FIG. 8 is a view of an example of the circuit structure of the unit pixel. The photoelectrons stored in the photoelectric conversion element 104 in the light receiving device 100 are transferred through transfer pathways 170a, 170b, 170c, and 170d to the floating diffusion layers 118 in the photoelectron distributors 106 (herein referred to as the photoelectron distributors 106a, 106b, 106c, and 106d for illustrative purposes). Each of the transfer pathways 146a, 146b, 146c, and 146d contains the first transfer unit 112, the photoelectron hold unit 114, and the second transfer unit 116 in each of the photoelectron distributors 106a, 106b, 106c, and 106d. The floating diffusion layers 118 in the photoelectron distributors 106a, 106b, 106c, and 106d are connected to the source of one reset transistor 126 and to one gate of signal read transistor 130.

Before the photoelectrons held in the photoelectron hold unit 114 are transferred to the floating diffusion layer 118 in each of the photoelectron distributors 106a, 106b, 106c, and 106d, the reset transistor 126 is turned on to reset the floating diffusion layer 118 at the reference potential, and the voltage of the floating diffusion layer 118 at the time (hereinafter referred to as the black level) is read from the signal read line 132. Then, the photoelectrons held in the photoelectron hold unit 114 are sequentially transferred to the floating diffusion layer 118. The photoelectrons transferred to the floating diffusion layer 118 are sequentially converted to a voltage signal (signal level) by the signal read transistor 130, and the voltage signal is read from the signal read line 132 through the selection transistor 134.

Specifically, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106a, and the voltage signal (signal level) corresponding to the transferred photoelectrons is read from the signal read line 132. Next, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106b, and the voltage signal (signal level) corresponding to the transferred photoelectrons is read from the signal read line 132. Furthermore, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106c, and the voltage signal (signal level) corresponding to the transferred photoelectrons is read from the signal read line 132. Finally, the reset transistor 126 is turned on, whereby the potential of each floating diffusion layer 118 is reset to read the black level, then the photoelectrons held in the photoelectron hold unit 114 are transferred to the floating diffusion layer 118 in the photoelectron distributor 106d, and the voltage signal (signal level) corresponding to the transferred photoelectrons is read from the signal read line 132.

All the voltage signals corresponding to the photoelectrons collected and held in the photoelectron hold units 114 of the photoelectron distributors 106a, 106b, 106c, and 106d in the light receiving device 100 are read from the same signal read line 132 in this manner. It should be noted that the photoelectron dischargers 108 are omitted from FIG. 8.

Figure 9:
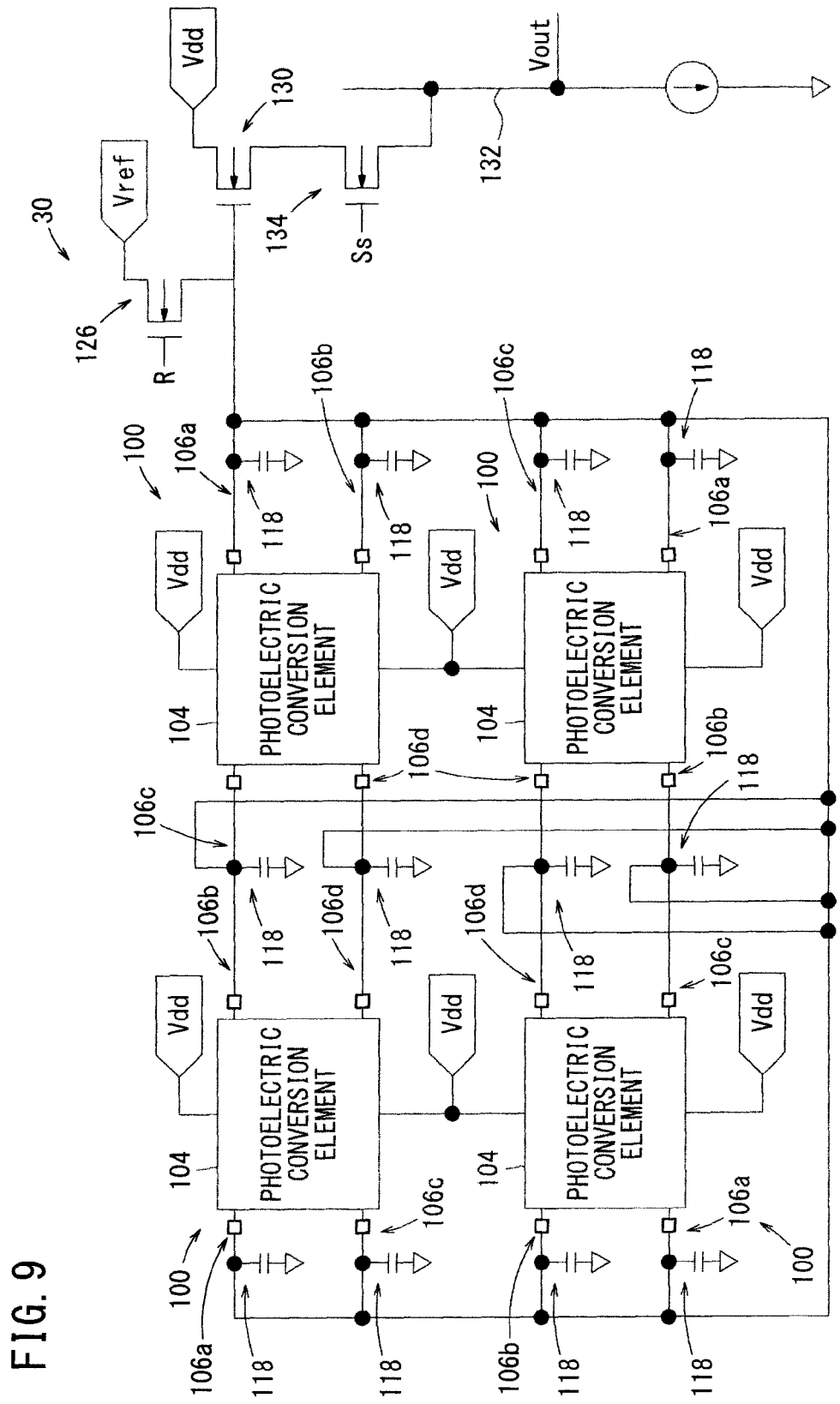
FIG. 9 is a circuit diagram of the unit pixel of FIG. 4 using a plurality of light receiving devices shown in FIG. 8.

FIG. 9 is a circuit diagram of the unit pixel 30 of FIG. 4 using the light receiving device 100 of FIG. 8. The unit pixel 30 has the four light receiving devices 100, each of which has the one photoelectric conversion element 104, four photoelectron distributors 106a, 106b, 106c, and 106d, and two photoelectron dischargers 108. The photoelectron dischargers 108 are omitted also in FIG. 9. In all the light receiving devices 100, the floating diffusion layers 118 of the photoelectron distributors 106a, 106b, 106c, and 106d are each connected to the source of the reset transistor 126 and the gate of the signal read transistor 130.

The reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106a, and the voltage signal (signal level) corresponding to the transferred photoelectrons is read from the signal read line 132. Thus, a voltage signal corresponding to the total electric charge amount (total number) of the photoelectrons, transferred to the floating diffusion layers 118 of the photoelectron distributors 106a in the light receiving devices 100 of the unit pixel 30, is read from the signal read line 132.

Next, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106b, and the voltage signal (signal level) corresponding to the transferred photoelectrons is read from the signal read line 132. Thus, a voltage signal corresponding to the total electric charge amount of the photoelectrons, transferred to the floating diffusion layers 118 of the photoelectron distributors 106b in the light receiving devices 100 of the unit pixel 30, is read from the signal read line 132.

Furthermore, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106c, and the voltage signal (signal level) corresponding to the transferred photoelectrons is read from the signal read line 132. Thus, a voltage signal corresponding to the total electric charge amount of the photoelectrons, transferred to the floating diffusion layers 118 of the photoelectron distributors 106c in the light receiving devices 100 of the unit pixel 30, is read from the signal read line 132.

Finally, the reset transistor 126 is turned on, whereby the potential of each floating diffusion layer 118 in the photoelectron distributors 106a, 106b, 106c, and 106d is reset to read the black level, then the photoelectrons held in the photoelectron hold unit 114 are transferred to the floating diffusion layer 118 in each photoelectron distributor 106d, and the voltage signal (signal level) corresponding to the transferred photoelectrons is read from the signal read line 132. Thus, a voltage signal corresponding to the total electric charge amount of the photoelectrons, transferred to the floating diffusion layers 118 of the photoelectron distributors 106d in the light receiving devices 100 of the unit pixel 30, is read from the signal read line 132. All the voltage signals corresponding to the photoelectrons held in the photoelectron hold units 114 of the light receiving devices 100 in the unit pixel 30 are read from the same signal read line 132 in this manner.

As shown in FIG. 9, in the unit pixel 30, the photoelectron distributors 106a, 106b, 106c, and 106d in each light receiving device 100 have different transfer directions. For example, the photoelectron distributor 106a in the upper-right light receiving device 100 has an upper-right transfer direction, the photoelectron distributor 106a in the lower-right light receiving device 100 has a lower-right transfer direction, the photoelectron distributor 106a in the upper-left light receiving device 100 has an upper-left transfer direction, and the photoelectron distributor 106a in the lower-left light receiving device 100 has a lower-left transfer direction.

The photoelectron distributors 106c and 106d in the upper-right light receiving device 100 and the photoelectron distributors 106b and 106d in the upper-left light receiving device 100 share the floating diffusion layers 118, and the photoelectron distributors 106d and 106b in the lower-right light receiving device 100 and the photoelectron distributors 106d and 106c in the lower-left light receiving device 100 share the floating diffusion layers 118.

Figure 10:
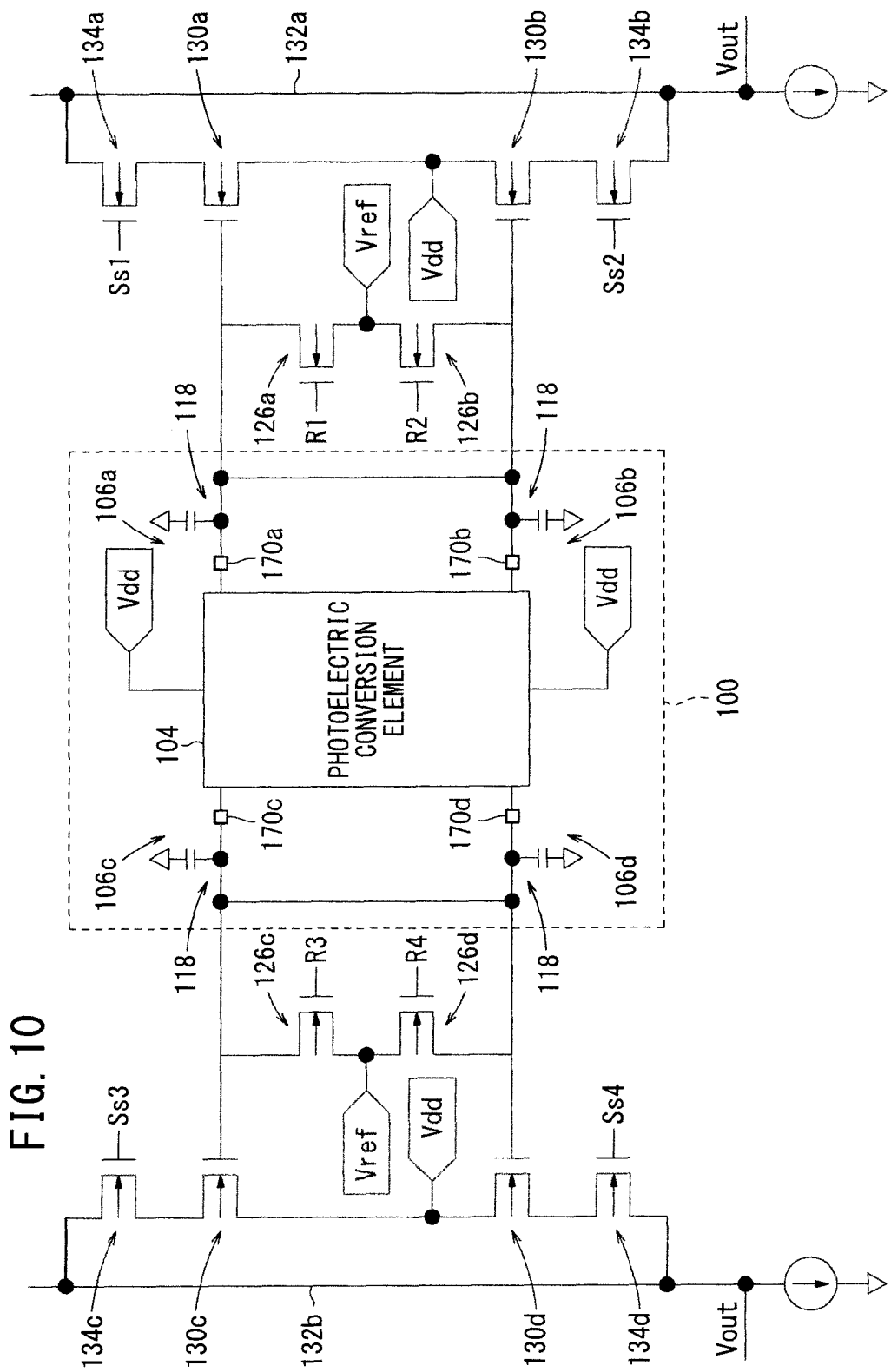
FIG. 10 is a view of another circuit structure of the unit pixel different from that of FIG. 8.

As shown in FIG. 10, the light receiving device 100 may have two signal read lines 132a and 132b. In this case, for example, the voltage signals corresponding to the photoelectrons transferred to the floating diffusion layers 118 in the photoelectron distributors 106a and 106b are read from the signal read line 132a, and the voltage signals corresponding to the photoelectrons transferred to the floating diffusion layers 118 in the photoelectron distributors 106c and 106d are read from the signal read line 132b. In the light receiving device 100 shown in FIG. 10, the sources of reset transistors 126a, 126b, 126c, and 126d are connected to the floating diffusion layers 118 of the photoelectron distributors 106a, 106b, 106c, and 106d, and the resetting voltage Vref is applied from the power source 20 to the drains. Furthermore, resetting signals R1, R2, R3, and R4 are supplied to the gates of the reset transistors 126a, 126b, 126c, and 126d. In addition, the gates of signal read transistors 130a, 130b, 130c, and 130d are connected to the floating diffusion layers 118 in the photoelectron distributors 106a, 106b, 106c, and 106d, and selection signals Ss1, Ss2, Ss3, and Ss4 are supplied to the gates of selection transistors 134a, 134b, 134c, and 134d. Thus, it is only necessary to connect the signal read line 132 with the floating diffusion layers 118 in the light receiving device 100.

The photoelectrons held in each photoelectron hold unit 114 in the light receiving device 100 shown in FIG. 10 may be read by using a separate signal read transistor 130 in this manner.

The light receiving device 100 has the four photoelectron distributors 106a, 106b, 106c, and 106d containing the photoelectron hold units 114 in this manner, so that the distance to the target object W can be obtained by the distance measuring system 10. Specifically, the photoelectrons generated in the photoelectric conversion element 104 in the first storage period are transferred to the photoelectron hold unit 114 in the photoelectron distributor 106a, the photoelectrons generated in the photoelectric conversion element 104 in the second storage period are transferred to the photoelectron hold unit 114 in the photoelectron distributor 106b, the photoelectrons generated in the photoelectric conversion element 104 in the third storage period are transferred to the photoelectron hold unit 114 in the photoelectron distributor 106c, and the photoelectrons generated in the photoelectric conversion element 104 in the fourth storage period are transferred to the photoelectron hold unit 114 in the photoelectron distributor 106d.

In FIG. 4, the arrows shown in the photoelectric conversion elements 104 in the light receiving devices 100 each represent a photoelectron transfer direction in one of the four storage periods shown in FIG. 1. Specifically, the photoelectrons generated in the upper-left photoelectric conversion element 104 are transferred to the upper-left photoelectron distributor 106, the photoelectrons generated in the lower-left photoelectric conversion element 104 are transferred to the lower-left photoelectron distributor 106, the photoelectrons generated in the upper-right photoelectric conversion element 104 are transferred to the upper-right photoelectron distributor 106, and the photoelectrons generated in the lower-right photoelectric conversion element 104 are transferred to the lower-right photoelectron distributor 106.

In this embodiment, the unit pixel 30 contains a plurality of the light receiving devices 100. The photoelectrons, which are allocated by the photoelectron distributors 106 in the different transfer directions in the light receiving devices 100 of the unit pixel 30, are summed up (accumulated) and output. Therefore, the variation in the number of the photoelectrons transferred in each allocation direction can be reduced without depending on the allocation directions.

Specifically, after the light-receiving and transfer processes are repeated multiple times, the photoelectrons in the photoelectron distributors 106 are transferred to the floating diffusion layers 118. Since the photoelectrons are vertically and horizontally transferred, once stored, and then transferred to the floating diffusion layers 118, the photoelectron transfer speeds between the photoelectric conversion elements 104 and the first transfer units 112 can be averaged in the vertical and horizontal directions. Thus, when the four photoelectric conversion elements 104 have the different vertical and horizontal transfer directions in each of the four storage periods shown in FIG. 1, the photoelectron transfer speeds do not depends on the allocation directions in the unit pixel 30, and calculation processes can be accurately carried out in a latter signal processing.

In a case where the unit pixel 30 has only one light receiving device 100, the transfer speed may be lowered in one direction due to the production or crystal orientation of the light receiving device 100, and the photoelectron information (the voltage signal corresponding to the photoelectrons) cannot be accurately obtained in an allocation direction. The time for allocating the photoelectrons generated in the photoelectric conversion element 104 (the timings at which the gate drive signals Sb, Sc, and Sd are supplied to the first transfer unit 112, the photoelectron hold unit 114, and the second transfer unit 116) is predetermined. Thus, when the photoelectrons are transferred in the allocation direction at the lowered transfer speed, it is impossible to transfer all the photoelectrons generated in the photoelectric conversion element 104.

In this embodiment, the light receiving device 100 in the unit pixel 30 has the photoelectron distributors 106 each containing the first transfer unit 112 for transferring the photoelectrons generated in the photoelectric conversion element 104, the photoelectron hold unit 114 for temporarily storing the photoelectrons, the second transfer unit 116 for transferring the photoelectrons stored in the photoelectron hold unit 114, and the floating diffusion layer 118 for storing the transferred photoelectrons and converting them to the voltage. Therefore, the photoelectrons generated in the photoelectric conversion element can be distributed in a plurality of directions and then read out, and the reset noise can be accurately removed.

The photoelectrons, which are generated in the photoelectric conversion element 104 and allocated by the photoelectron distributor 106, are held in the photoelectron hold unit 114. In the process of reading the photoelectrons held in the photoelectron hold unit 114, first the potential of the floating diffusion layer 118 in the photoelectron distributor 106 is reset to read the black level, then the photoelectrons accumulated and held in the photoelectron hold unit 114 are transferred to the floating diffusion layer 118, and the voltage signal corresponding to the photoelectrons is read out. Therefore, the gap between the reset timing and the read timing for the potential of the floating diffusion layer 118 can be minimized. Thus, the black level can be accurately obtained, and the reset noise can be accurately removed.

The unit pixel 30 contains a plurality of the light receiving devices 100. Therefore, the variation in the number of the photoelectrons transferred in each allocation direction, which depends on the variation in the transfer speed due to the production or crystal orientation of the light receiving device 100, can be reduced to improve the receiving accuracy. Furthermore, since the light receiving devices 100 in the unit pixel 30 share at least part of the floating diffusion layers 118, the unit pixel can be miniaturized and the chip area can be reduced, whereby the costs for the unit pixel 30 can be reduced and the resolution of the unit pixels 30 can be increased.

The unit pixel 30 has the four light receiving devices 100 arranged in a matrix, each light receiving device 100 has the four photoelectron distributors 106, each two of the four photoelectron distributors 106 are arranged in the horizontal direction symmetrically with respect to the photoelectric conversion element 104, and the light receiving devices 100 adjacent to each other in the horizontal direction share the floating diffusion layers 118 formed therebetween. As a result, the unit pixel 30 can be miniaturized and the chip area can be reduced, whereby the costs for the unit pixel 30 can be reduced and the resolution of the unit pixels 30 can be increased.

The solid-state image sensing device 28, which contains the pixel array 32 containing the unit pixels 30 arranged one- or two-dimensionally, has the signal read transistor 130 for reading the potentials of the floating diffusion layers 118 and the signal read line 132 for reading the signals from the signal read transistor 130. The potentials of the floating diffusion layers 118 in the unit pixel 30 are read from the one signal read transistor 130. Therefore, a signal read circuit can be shared, the output variation due to the production of circuits can be reduced, and the solid-state image sensing device 28 can be miniaturized to increase the resolution.

When the first and second storage periods (in which only the ambient light Ls is received) and the third and fourth storage periods (in which the ambient light Ls and the reflected light Lr are received) have the same time length to obtain the distance to the target object W, the received light amount in the first storage period is equal to that in the second storage period. Therefore, the second storage period may be replaced by the first storage period. In this case, $Q_{CA}$ may be considered to be equal to $Q_{CB}$ to obtain the distance to the object. Thus, the unit pixel 30 may have a structure shown in FIG. 11.

Figure 11:
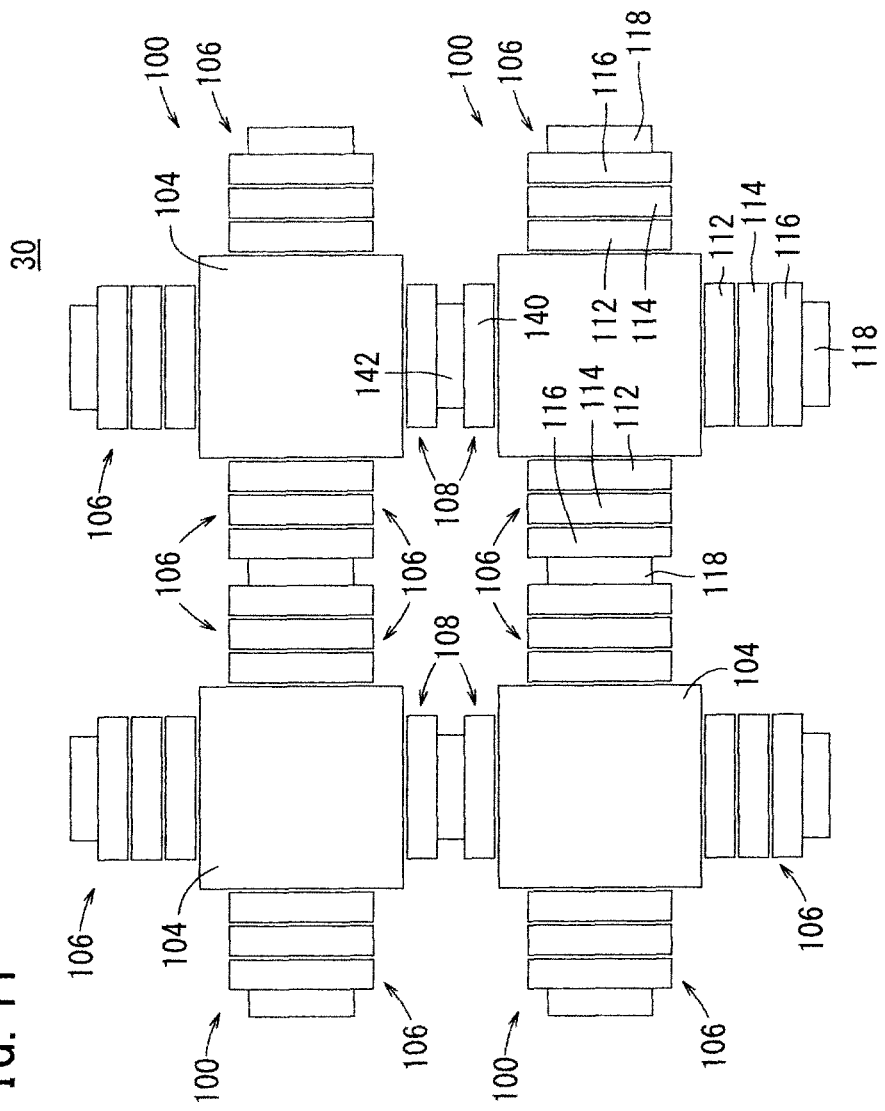
FIG. 11 is a plan view of another unit pixel other than that of FIG. 4.

FIG. 11 is a plan view of another unit pixel 30 contained in the solid-state image sensing device 28 of FIG. 3. The same components are marked with the same numerals in FIGS. 4 and 11. The unit pixel 30 has four light receiving devices 100 arranged in a matrix. The light receiving device 100 has one photoelectric conversion element 104, three photoelectron distributors 106, and one photoelectron discharger 108. Two of the three photoelectron distributors 106 are arranged in the horizontal direction symmetrically with respect to the photoelectric conversion element 104, and the other one is formed on the top or bottom of the photoelectric conversion element 104. The photoelectron discharger 108 is formed on the bottom or top of the photoelectric conversion element 104, on which the photoelectron distributor 106 is not formed. In the two upper light receiving devices 100 in the unit pixel 30, the photoelectron distributor 106 is formed on the top of the photoelectric conversion element 104, and the photoelectron discharger 108 is formed on the bottom. In the two lower light receiving devices 100 in the unit pixel 30, the photoelectron distributor 106 is formed on the bottom of the photoelectric conversion element 104, and the photoelectron discharger 108 is formed on the top. In the structure of the unit pixel 30, the light receiving devices 100 adjacent to each other in the vertical direction share a diffusion layer 142 formed therebetween. Furthermore, in the unit pixel 30, the light receiving devices 100 adjacent to each other in the horizontal direction share a floating diffusion layer 118 formed therebetween.

Thus, the unit pixel 30 has the four light receiving devices 100 arranged in a matrix, the light receiving device 100 has the three photoelectron distributors 106, two of the three photoelectron distributors 106 are arranged in the horizontal direction symmetrically with respect to the photoelectric conversion element 104, the other photoelectron distributor 106 is formed on the top or bottom of the photoelectric conversion element 104, and the light receiving devices 100 adjacent to each other in the horizontal direction share the floating diffusion layer 118 formed therebetween. Therefore, the unit pixel 30 can be miniaturized and the chip area can be reduced, whereby the costs for the unit pixel 30 can be reduced and the resolution of the unit pixels 30 can be increased.

The image capturing operation of the unit pixel 30 will be described below. One frame of the unit pixel 30 for capturing one luminance image includes an exposure period and a readout period. The photoelectric conversion element 104 detects a light in the exposure period, and the photoelectrons generated in the exposure period are read from the signal read line 132 in the readout period.

The irradiation unit 12 emits the irradiation light toward the target object W in the exposure period, and the photoelectrons are generated and stored in the photoelectric conversion element 104 in the first, second, third, and fourth storage periods. The irradiation light is emitted predetermined times (e.g. 100 times) at a predetermined cycle in the exposure period in one frame. The photoelectric conversion element 104 receives the light predetermined times (e.g. 100 times) in the first, second, third, and fourth storage periods.

The photoelectrons generated in the photoelectric conversion element 104 by the light received in the first storage period are transferred to the photoelectron hold unit 114 in the photoelectron distributor 106a, the photoelectrons generated in the photoelectric conversion element 104 by the light received in the second storage period are transferred to the photoelectron hold unit 114 in the photoelectron distributor 106b, the photoelectrons generated in the photoelectric conversion element 104 by the light received in the third storage period are transferred to the photoelectron hold unit 114 in the photoelectron distributor 106c, and the photoelectrons generated in the photoelectric conversion element 104 by the light received in the fourth storage period are transferred to the photoelectron hold unit 114 in the photoelectron distributor 106d. The light-receiving process in the first, second, third, and fourth storage periods are performed predetermined times in the exposure period in one frame, whereby the photoelectrons generated in the photoelectric conversion element 104 in the exposure period in one frame are allocated predetermined times to the photoelectron hold unit 114 of each photoelectron distributor 106. The photoelectrons generated in the photoelectric conversion element 104 are accumulated and held in the photoelectron hold unit 114 of each photoelectron distributor 106 in this manner.

Then, after the exposure period, the photoelectrons stored in the photoelectron hold units 114 in the photoelectron distributors 106a, 106b, 106c, and 106d are sequentially read from the signal read line 132 in the readout period.

The photoelectrons corresponding to $Q_{CB}$, $Q_{CA}$, $Q_B$, and $Q_A$ can be obtained in this manner. The distance to the target object W can be obtained by reading the voltage signals corresponding to the photoelectrons obtained from the floating diffusion layers 118 in the photoelectron distributors 106a, 106b, 106c, and 106d.

The photoelectrons generated by the light incident on the photoelectric conversion element 104 in periods other than the storage periods are discharged from the diffusion layer 142 through the third transfer unit 140 in accordance with the discharge signal Se input from the gate drive circuit 44 to the third transfer gate 144.

Figure 12:
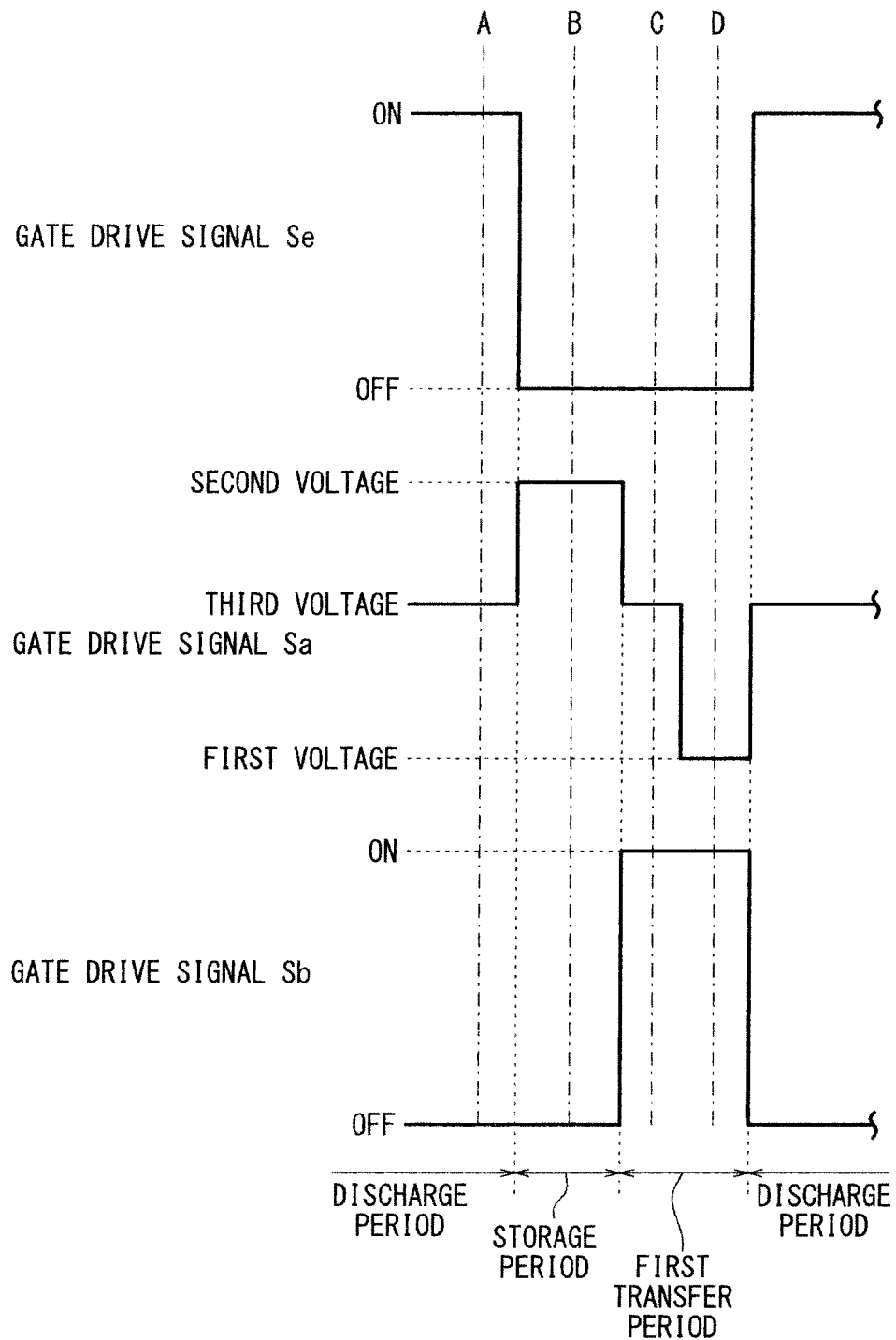
FIG. 12 is a time chart of gate drive signals applied to a photogate, a first transfer gate, and a third transfer gate according to an example.
Figure 13:
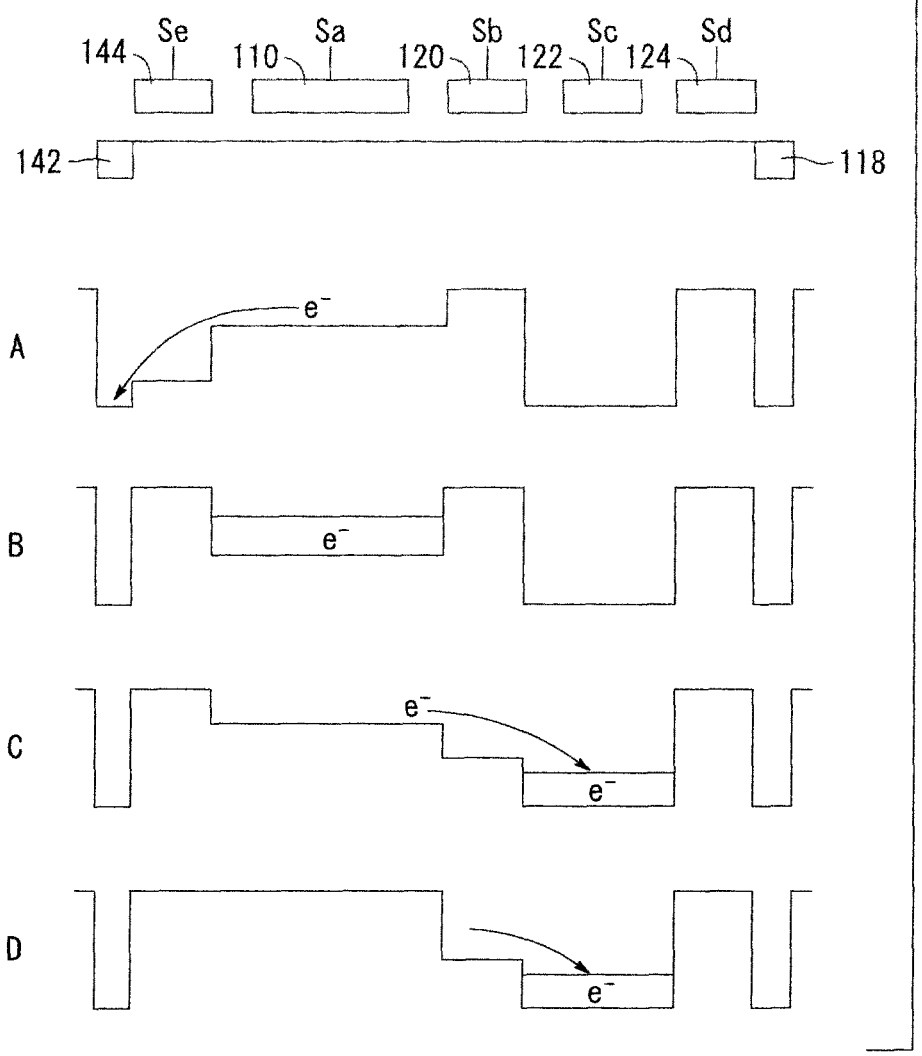
FIG. 13 is a potential diagram of a substrate surface of a photoelectric conversion element and a photoelectron distributor at each timing shown in the time chart of FIG. 12.

A method for driving the photoelectric conversion element 104 will be described below. FIG. 12 is a time chart of the gate drive signals Sa, Sb, and Se applied to the photogate 110 of the photoelectric conversion element 104, the first transfer gate 120, and the third transfer gate 144, and FIG. 13 is a potential diagram of the substrate surface of the photoelectric conversion element 104 and the photoelectron distributor 106 at each timing in the time chart of FIG. 12. It should be noted that FIG. 13 is a potential diagram of a cross-section taken along the line A-A of FIG. 4.

As shown in FIG. 12, at a timing A in a discharge period, the gate drive circuit 44 turns on the third switch 160 and turns off the first switch 156 and the second switch 158, whereby the gate drive signal Sa of the third voltage is applied to the photogate 110 to discharge the photoelectrons e⁻ in the photoelectric conversion element 104. Furthermore, at the timing A, the gate drive circuit 44 applies a voltage (the gate drive signal Sb) to turn off the first transfer gate 120 and applies a voltage (the gate drive signal Se) to turn on the third transfer gate 144.

As shown in FIG. 13, at the timing A, the potential of the photoelectric conversion element 104 is lowered by a level corresponding to the third voltage applied to the photogate 110, and the potential barrier of the third transfer unit 140 is lowered (or removed). As a result, the photoelectrons e⁻ generated in the photoelectric conversion element 104 can be discharged to the diffusion layer 142 under a bias.

The first transfer unit 112 has a high potential barrier, so that the photoelectrons generated in the photoelectric conversion element 104 are not transferred to the photoelectron hold unit 114. In a case where the gate drive signal Sa of the second voltage is applied to the photogate 110 at the timing A to lower the potential of the photoelectric conversion element 104, the potential gradient cannot be obtained, the photoelectrons tend to remain on the surface of the photoelectric conversion element 104, and a satisfactory reset performance often cannot be obtained. Furthermore, in a case where the gate drive signal Sa of the first voltage is applied to the photogate 110 at the timing A to increase the potential of the photoelectric conversion element 104, the photoelectrons generated deep in the substrate of the photoelectric conversion element 104 cannot be collected in the substrate surface, are hardly discharged, and may cause a leak current toward the photoelectron hold unit 114.

As shown in FIG. 12, at a timing B in a storage period, the gate drive circuit 44 turns on the second switch 158 and turns off the first switch 156 and the third switch 160, whereby the gate drive signal Sa of the second voltage is applied to the photogate 110. Furthermore, at the timing B, the gate drive circuit 44 applies voltages (the gate drive signals Sb and Se) to turn off the first transfer gate 120 and the third transfer gate 144.

As shown in FIG. 13, at the timing B, the potential of the photoelectric conversion element 104 is lowered by a level corresponding to the applied second voltage, and the potential barrier of the third transfer unit 140 is increased (the third transfer unit 140 is switched from the on state to the off state). In addition, the first transfer unit 112 maintains the high potential barrier (the first transfer unit 112 is in the off state). The third voltage may be applied instead of the second voltage to the photogate 110 in the storage period. The photoelectrons can be stored also under the third voltage.

As shown in FIG. 12, after the storage period, at a timing C in a first transfer period, the gate drive circuit 44 turns on the third switch 160 and turns off the first switch 156 and the second switch 158, whereby the gate drive signal Sa of the third voltage is applied to the photogate 110, to transfer the photoelectrons e⁻ stored in the photoelectric conversion element 104 to the photoelectron hold unit 114. Furthermore, at the timing C, the gate drive circuit 44 applies a voltage (the gate drive signal Sb) to turn on the first transfer gate 120 and applies a voltage (the gate drive signal Se) to turn off the third transfer gate 144.

As shown in FIG. 13, at the timing C, the potential of the photoelectric conversion element 104 is increased by a level corresponding to the applied third voltage, and the potential barrier of the first transfer unit 112 is lowered (the first transfer unit 112 is switched from the off state to the on state), whereby the photoelectrons generated in the photoelectric conversion element 104 are transferred to the photoelectron hold unit 114. Since the potential of the photoelectric conversion element 104 is increased by the level corresponding to the applied gate drive signal Sa of the third voltage, even the photoelectrons generated deep in the substrate of the photoelectric conversion element 104 are collected in the substrate surface and transferred to the photoelectron hold unit 114. Therefore, the transfer period, in which the gate drive signal Sa of the third voltage is applied to the photogate 110 and the ON voltage (the gate drive signal Sb) is applied to the first transfer gate 120, is considered also as a storage period.

As shown in FIG. 12, after the timing C, at a timing D as the first transfer period, the gate drive circuit 44 turns on the first switch 156 and turns off the second switch 158 and the third switch 160, whereby the gate drive signal Sa of the first voltage is applied to the photogate 110. Furthermore, at the timing D, the gate drive circuit 44 continuously applies the ON voltage (the gate drive signal Sb) to the first transfer gate 120 and applies the OFF voltage (the gate drive signal Se) to the third transfer gate 144.

As shown in FIG. 13, at the timing D, the potential of the photoelectric conversion element 104 is increased by a level corresponding to the applied first voltage, and the first transfer unit 112 maintains the low potential barrier.

In the first transfer period, the applied voltage of the gate drive signal Sa is shifted from the second voltage to the third voltage and from the third voltage to the first voltage in this manner, so that the potential of the photoelectric conversion element 104 is increased stepwise. Therefore, in the first transfer, the amount of the residual photoelectrons e⁻ remaining in the photoelectric conversion element 104 can be reduced, and the photoelectrons e⁻ can be efficiently transferred to the photoelectron hold unit 114. After the first transfer period has passed, the photoelectrons e⁻ generated in the photoelectric conversion element 104 are continuously discharged in the discharge period until the next storage period starts.

The procedures shown in FIGS. 12 and 13 are repeated predetermined times (e.g. 100 times) to hold the photoelectrons in the photoelectron hold unit 114. Then, in the readout period, the gate drive circuit 44 applies the gate drive signal Sd to turn on the second transfer gate 124 in the photoelectron distributor 106, the photoelectrons e⁻ collected and held in the photoelectron hold unit 114 are transferred to the floating diffusion layer 118, and the voltage signal corresponding to the photoelectrons e⁻ is read from the signal read line 132. As shown in FIG. 13, the gate drive circuit 44 applies the gate drive signal Sc to turn on the hold gate 122 in the discharge period, the storage period, and the first transfer period.

The photoelectrons generated in the photoelectric conversion element 104 may be transferred to the photoelectron hold unit 114 in the storage period. In this case, the voltage (the gate drive signal Sb) for turning on the first transfer gate 120 is applied also in the storage period. Thus, the storage period includes both the above described storage period and first transfer period of this embodiment, and also the above photoelectron transfer is carried out in the storage period.

The above embodiment may be modified as follows.

Modified Example 1

In Modified Example 1, in order to reliably discharge the photoelectrons e⁻ remaining in the photoelectric conversion element 104 before the start of the storage period, the photoelectrons e⁻ are discharged also in a pre-discharge period between the discharge period and the storage period.

Figure 14:
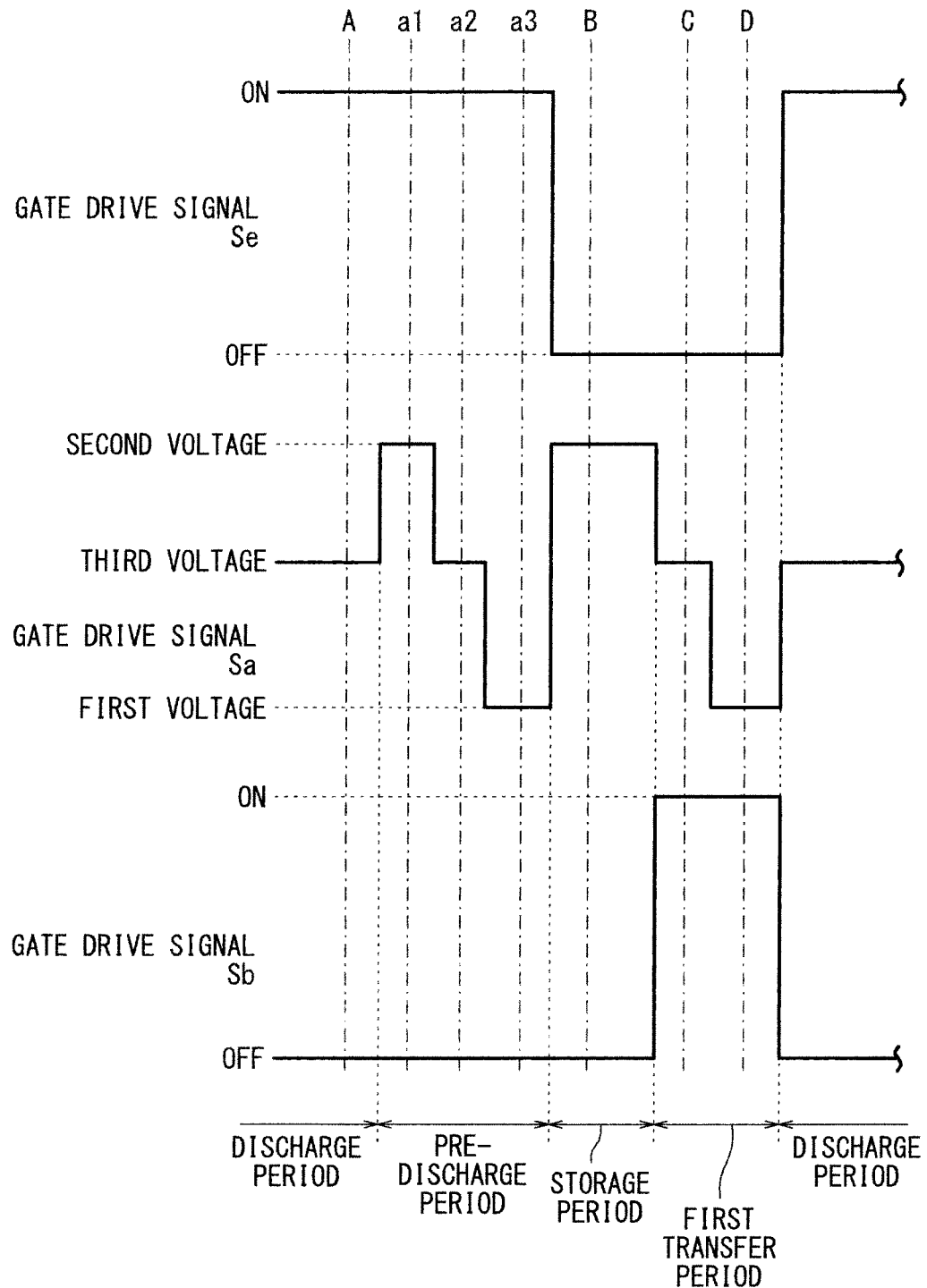
FIG. 14 is a time chart of gate drive signals applied to the photogate, the first transfer gate, and the third transfer gate according to Modified Example 1.
Figure 15:
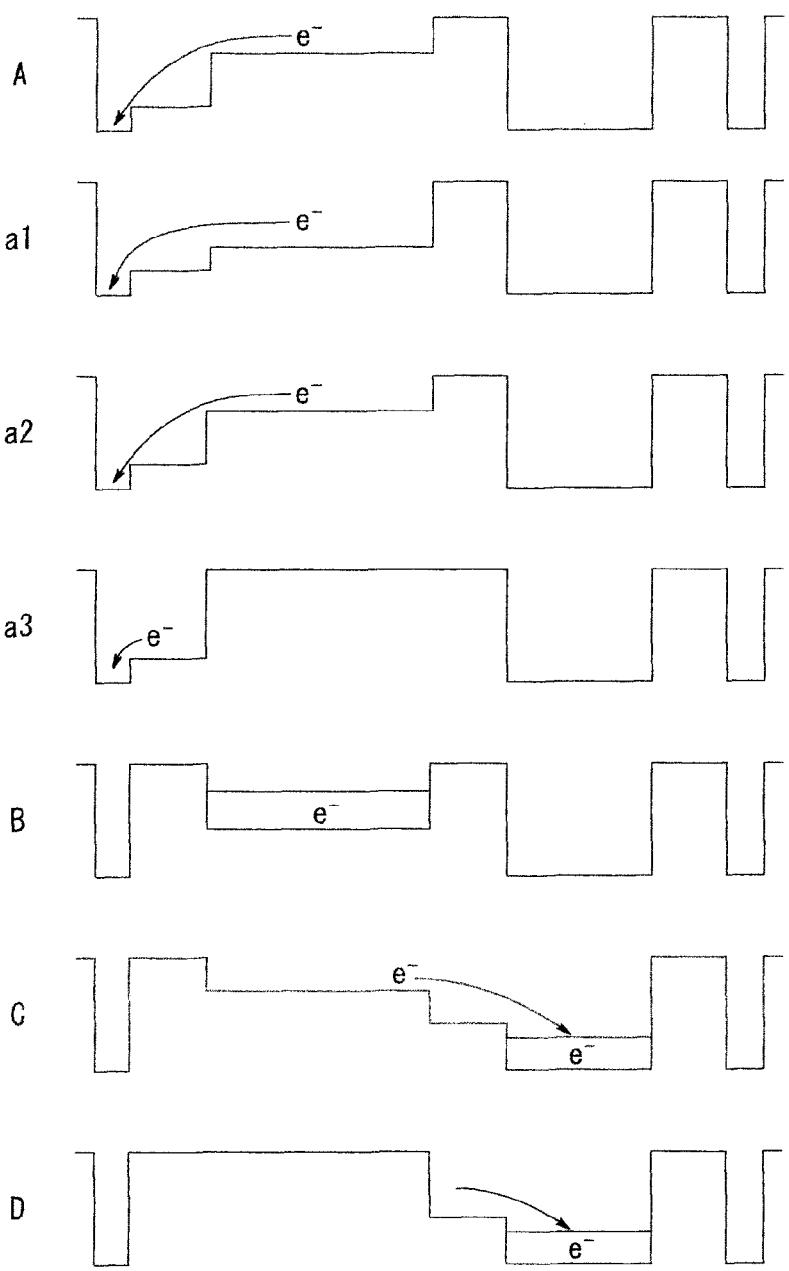
FIG. 15 is a potential diagram of the substrate surface of the light receiving device at each timing shown in the time chart of FIG. 14.

FIG. 14 is a time chart of the gate drive signals Sa, Sb, and Se applied to the photogate 110 of the photoelectric conversion element 104, the first transfer gate 120, and the third transfer gate 144 according to Modified Example 1, and FIG. 15 is a potential diagram of the substrate surface of the light receiving device 100 at each timing in the time chart of FIG. 14. FIG. 15 is a potential diagram of a cross-section taken along the line A-A of FIG. 4.

The operations of the light receiving device 100 at the timings A, B, C, and D of FIGS. 14 and 15 are equal to those of FIGS. 12 and 13, and therefore explanations thereof are omitted. In the pre-discharge period, the gate drive circuit 44 continuously applies the OFF voltage (the gate drive signal Sb) to the first transfer gate 120, and continuously applies the ON voltage (the gate drive signal Se) to the third transfer gate 144. Thus, in the pre-discharge period, the first transfer unit 112 maintains the high potential barrier, and the third transfer unit 140 maintains the low potential barrier.

As shown in FIG. 14, at a timing a1 in the pre-discharge period after the discharge period before the storage period, the gate drive circuit 44 turns on the second switch 158 and turns off the first switch 156 and the third switch 160, whereby the gate drive signal Sa of the second voltage is applied to the photogate 110 to discharge the photoelectrons $e^-$ in the photoelectric conversion element 104. As shown in FIG. 15, at the timing a1, the potential barrier of the photoelectric conversion element 104 is lowered.

As shown in FIG. 14, after the timing a1, at a timing a2 in the pre-discharge period, the gate drive circuit 44 turns on the third switch 160 and turns off the first switch 156 and the second switch 158, whereby the gate drive signal Sa of the third voltage is applied to the photogate 110. As shown in FIG. 15, at the timing a2, the potential of the photoelectric conversion element 104 is increased by a level corresponding to the applied third voltage.

As shown in FIG. 14, after the timing a2, at a timing a3 in the pre-discharge period, the gate drive circuit 44 turns on the first switch 156 and turns off the second switch 158 and the third switch 160, whereby the gate drive signal Sa of the first voltage is applied to the photogate 110. As shown in FIG. 15, at the timing a3, the potential of the photoelectric conversion element 104 is increased.

In the pre-discharge period, the applied voltage of the gate drive signal Sa is shifted from the second voltage to the third voltage and from the third voltage to the first voltage in this manner, so that the potential of the photoelectric conversion element 104 is increased stepwise. Therefore, the photoelectrons $e^-$ in the photoelectric conversion element 104 can be efficiently collected in the substrate surface and discharged to the diffusion layer 142, to reduce the amount of the residual photoelectrons remaining in the photoelectric conversion element 104.

Modified Example 2

Figure 16:
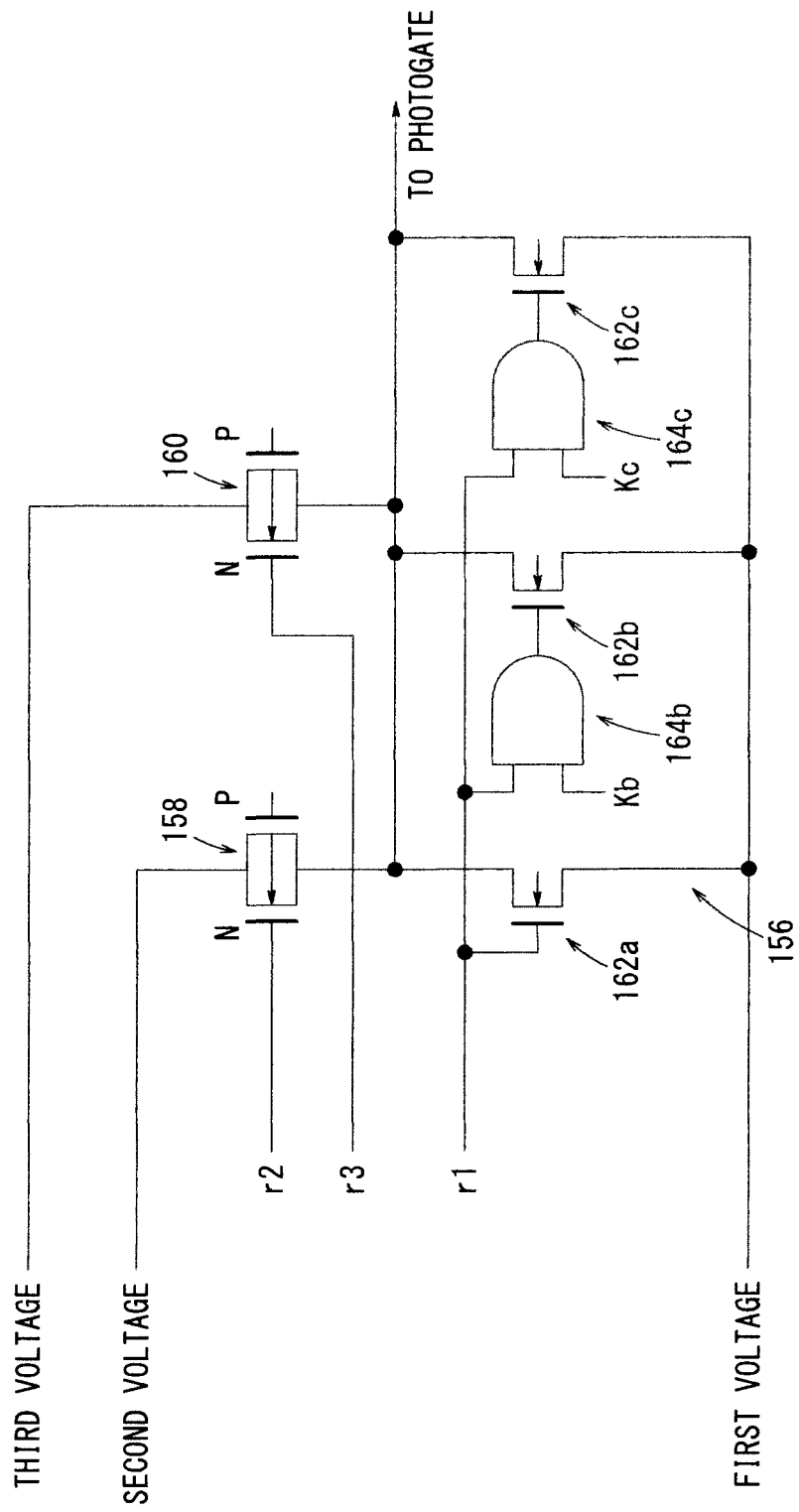
FIG. 16 is a structural view of first, second, and third switches according to Modified Example 2.

The above first switch 156, second switch 158, and third switch 160 may have the following structure. FIG. 16 is a structural view of the first switch 156, second switch 158, and third switch 160 according to Modified Example 2.

The second switch 158 and the third switch 160 each have a transfer gate of a CMOS switch containing an re-channel transistor N and a p-channel transistor P. An ON/OFF control signal r2 is applied to the second switch 158 to control the on/off state thereof, and an ON/OFF control signal r3 is applied to the third switch 160 to control the on/off state thereof.

When the second voltage is applied to the photogate 110, the gate drive circuit 44 applies the ON control signal r2 to the second switch 158. When the gate drive signal Sa of the third voltage is applied to the photogate 110, the gate drive circuit 44 applies the ON control signal r3 to the third switch 160.

The first switch 156 has a plurality of MOS (Metal-Oxide-Semiconductor) transistors 162 connected in parallel. An ON/OFF control signal r1 is applied to the gates of the MOS transistors 162 to control the on/off state of the first switch 156. The drains of the MOS transistors 162 are connected to the photogate 110, and the first voltage is applied to the sources.

The ON/OFF control signal r1 is input from a logic circuit 164 to at least one of the MOS transistors 162. The ON/OFF control signal r1 is input as a first signal to a first input terminal of the logic circuit 164, and a second signal K is input to a second input terminal of the logic circuit 164. The second signal K includes a setting value for controlling the time required to change the voltage of the gate drive signal Sa applied on the photogate 110 from the third or second voltage to the first voltage (i.e. the on-resistance value of the first switch).

In this embodiment, the first switch 156 has three MOS transistors 162 (hereinafter referred to as the MOS transistors 162a, 162b, and 162c) and two logic circuits 164 (hereinafter referred to as the logic circuits 164b and 164c). The ON/OFF control signal r1 is input from the logic circuit 164b to the MOS transistor 162b and from the logic circuit 164c to the MOS transistor 162c. The logic circuits 164 used in the embodiment are AND circuits.

The second signal K to be input to the second input terminal of the logic circuit 164b (hereinafter referred to as the second signal Kb) and the second signal K to be input to the second input terminal of the logic circuit 164c (hereinafter referred to as the second signal Kc) may be preliminarily selected by the gate drive circuit 44 to change the on-resistance value of the first switch 156.

For example, a high signal may be selected as the second signal Kb to be input to the logic circuit 164b, and a low signal may be selected as the second signal Kc to be input to the logic circuit 164c. In this case, when the ON control signal r1 is input to the first switch 156, the MOS transistors 162a and 162b are turned on (while the MOS transistor 162c is in the off state), and the first voltage is applied to the photogate 110 through the MOS transistors 162a and 162b connected in parallel.

Alternatively, for example, a high signal may be selected as both of the second signal Kb to be input to the logic circuit 164b and the second signal Kc to be input to the logic circuit 164c. In this case, when the ON control signal r1 is input to the first switch 156, all the MOS transistors 162a, 162b, and 162c are turned on, and the first voltage is applied to the photogate 110 through the MOS transistors 162a, 162b, and 162c connected in parallel.

Thus, by selecting the values of the second signals Kb and Kc to be input to the logic circuits 164b and 164c, the number of the MOS transistors 162 to be turned on can be controlled among the MOS transistors 162a, 162b, and 162c connected in parallel with each other, to change the on-resistance value of the first switch 156.

Figure 17:
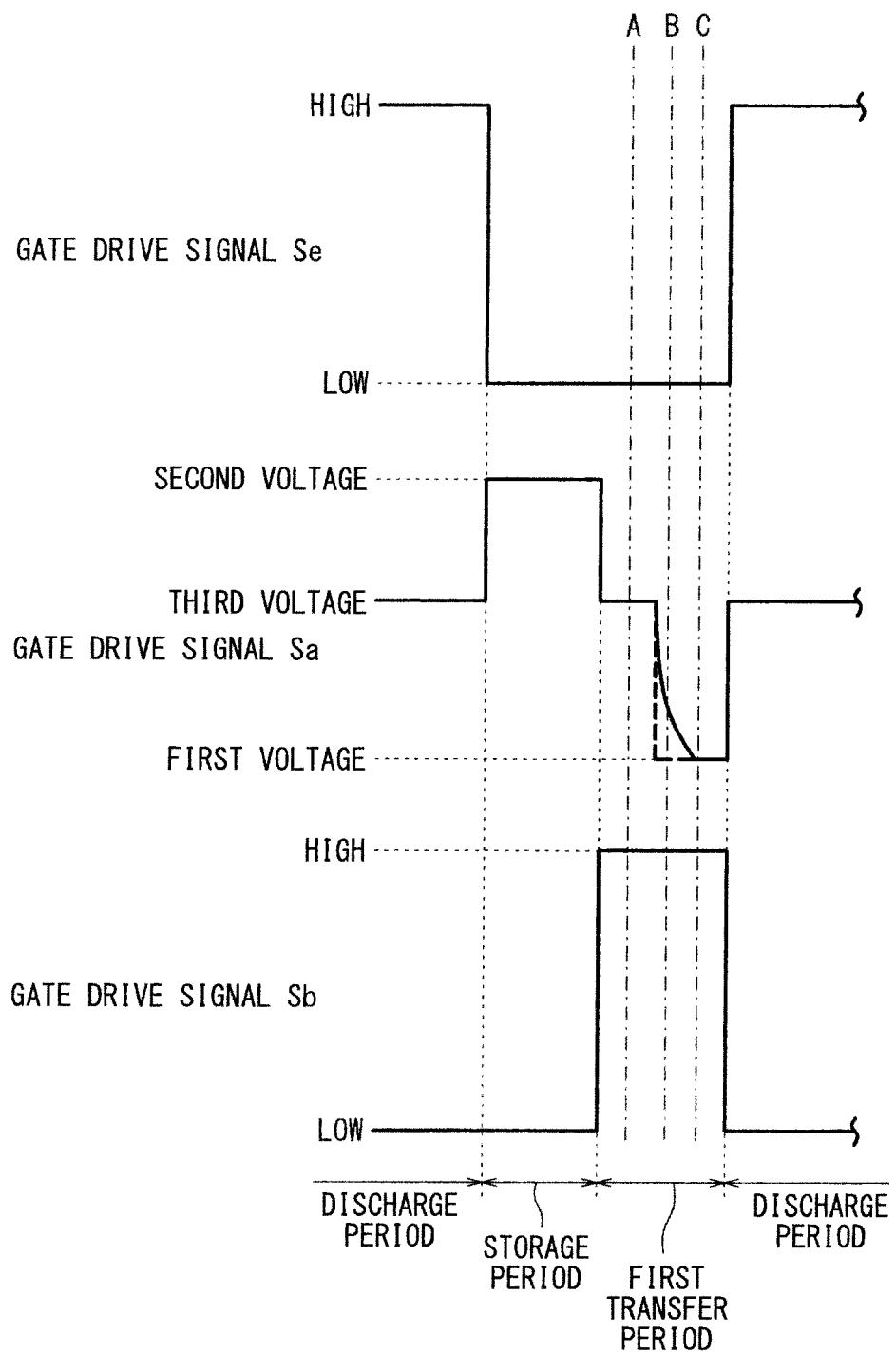
FIG. 17 is a time chart of gate drive signals applied to the photogate, the first transfer gate, and the third transfer gate according to Modified Example 2.

When the resistance value of the first switch 156 is changed to a desired (predetermined) value, the voltage of the gate drive signal Sa applied to the photogate 110 is switched from the third voltage to the first voltage so as to be gradually changed from the third voltage to the first voltage as shown in FIG. 17. As a result, the amount of the residual photoelectrons $e^-$ remaining in the photoelectric conversion element 104 can be minimized as much as possible in the transfer process to improve the photoelectron $e^-$ transfer efficiency. The rate of the change of the gate drive signal Sa applied to the photogate 110 from the third voltage to the first voltage depends on the resistance value of the first switch 156. FIG. 17 is a time chart of the gate drive signals Sa, Sb, and Se applied to the photogate 110 of the photoelectric conversion element 104, the first transfer gate 120, and the third transfer gate 144 according to Modified Example 2. The dotted line shown in FIG. 17 represents the change of the gate drive signal Sa in a case where the voltage signal applied to the photogate 110 is instantly switched from the third voltage to the first voltage.

The reason why the amount of the residual photoelectrons $e^-$ remaining in the photoelectric conversion element 104 in the transfer process can be minimized by changing the resistance value of the first switch 156 to the desired value will be described below. FIG. 18 is an example of a potential diagram in the substrate depth direction of the photoelectric conversion element 104 at each timing in the time chart of FIG. 17 in a case where the gate drive signal Sa applied to the photogate 110 is instantly switched from the third voltage to the first voltage.

At a timing A, the gate drive signal Sa of the third voltage is applied to the photogate 110, and the photoelectrons e⁻ generated in the photoelectric conversion element 104 are collected in the vicinity of the surface of the p-type semiconductor substrate 102 under a bias. Then, immediately after the voltage of the gate drive signal Sa applied to the photogate 110 is instantly switched from the third voltage to the first voltage, at a timing B, the potential of the surface of the photoelectric conversion element 104 is rapidly increased, whereby part of the photoelectrons e⁻ collected in the surface of the photoelectric conversion element 104 are transferred in the depth direction of the p-type semiconductor substrate 102. Thus, at a timing C, the photoelectrons e⁻ deep in the substrate of the p-type semiconductor substrate 102 remains in the photoelectric conversion element 104. At this timing, though the gate drive signal Sb for turning on the first transfer gate 120 is applied, the potential barrier of the surface of the photogate 110 is rapidly increased, so that the photoelectrons e⁻ transferred deeper in the substrate of the photoelectric conversion element 104 cannot be collected again in the surface in the transfer period, thereby resulting in a low efficiency of transferring or discharging the photoelectrons e⁻ to the photoelectron hold unit 114 or the photoelectron discharger.

FIG. 19 is an example of a potential diagram in the depth direction of the photoelectric conversion element 104 at each timing in the time chart of FIG. 17 in a case where the resistance value of the first switch 156 is controlled at the desired value according to Modified Example 2.

At a timing A, the gate drive signal Sa of the third voltage is applied to the photogate 110, and the photoelectrons e⁻ generated in the photoelectric conversion element 104 are collected in the surface of the p-type semiconductor substrate 102. At a timing B in the process of gradually changing the voltage of the gate drive signal Sa applied to the photogate 110 from the third voltage to the first voltage, the potential of the surface of the photoelectric conversion element 104 is gradually increased, and the collected photoelectrons e⁻ are not diffused in the depth direction of the p-type semiconductor substrate 102 and remain in the surface. Thus, the photoelectrons e⁻ can be transferred to the photoelectron hold unit 114 due to the surface potential gradient between the photoelectric conversion element 104 and the photoelectron hold unit 114. Then, at the timing C where the gate drive signal Sa of the first voltage is completely applied to the photogate 110, the photoelectrons e⁻ do not remain in the photoelectric conversion element 104 because they have been transferred to the photoelectron hold unit 114.

When the on resistance of the first switch 156 is controlled to the desired value in this manner, the voltage of the gate drive signal Sa applied to the photogate 110 is gradually changed from a higher voltage to the first voltage, whereby the amount the residual photoelectrons e⁻ remaining in the photoelectric conversion element 104 can be minimized in the transfer process to improve the photoelectron e⁻ transfer efficiency.

The voltage applied to the photogate 110 may be gradually changed also from the second voltage to the first voltage by controlling the resistance value of the first switch 156 in the same manner.

Modified Example 3

Though the unit pixel 30 has the four light receiving devices 100 in the above embodiment and Modified Examples 1 and 2, the unit pixel 30 may have only one light receiving device 100 or a plurality of light receiving devices 100 (e.g. two, three, or five light receiving devices 100). Furthermore, though the light receiving device 100 has the four photoelectron distributors 106 in the above examples, the light receiving device 100 may have only one photoelectron distributor 106 or a plurality of photoelectron distributors 106 (e.g. two, three, or five photoelectron distributors 106).

In addition, though the first switch 156, the second switch 158, and the third switch 160 are formed in the gate drive circuit 44 in the above examples, they may be formed outside the gate drive circuit 44.

Although the present invention has been described with reference to the above embodiment, the scope of the invention is not limited to the embodiment. It will be apparent to those skilled in the art that various changes and modifications may be made to the embodiment without departing from the scope of the invention as set forth in the appended claims.

What is claimed is:

1. A solid-state image sensing device comprising
a unit pixel containing a photoelectric conversion element for detecting a light to generate photoelectrons, and
a pixel drive circuits for driving the unit pixel,
wherein the photoelectric conversion element has a photogate structure,
the pixel drive circuits are configured to apply a voltage selected from three voltages directly to a photogate of the photoelectric conversion element to store or transfer the photoelectrons,
the three voltages include at least a first voltage, a second voltage higher than the first voltage, and a third voltage higher than the first voltage and lower than the second voltage
the pixel drive circuits are configured to apply the third voltage directly to the photogate to discharge the photoelectrons generated in the photoelectric conversion element in a discharge period,
the pixel drive circuits are configured to apply the second voltage or the third voltage directly to the photogate to store the photoelectrons generated in the photoelectric conversion element in a storage period after the discharge period, and
the pixel drive circuits are configured to apply the third voltage directly to the photogate and then apply the first voltage directly to the photogate to transfer the photoelectrons stored in the photoelectric conversion element to a photoelectron hold unit in a first transfer period after the storage period.

2. The solid-state image sensing device according to claim 1, wherein the unit pixel further contains a third transfer unit for transferring the photoelectrons generated in the photoelectric conversion element to a diffusion layer to discharge the photoelectrons, and
the pixel drive circuits are configured to turn on the third transfer unit to transfer the photoelectrons to the diffusion layer in the discharge period.

3. The solid-state image sensing device according to claim 1, wherein the unit pixel further contains a first transfer unit for transferring the photoelectrons generated in the photoelectric conversion element to the photoelectron hold unit, the photoelectrons being repeatedly collected, held, and accumulated in the photoelectron hold unit, and
the pixel drive circuits are configured to turn on the first transfer unit to transfer the photoelectrons to the photoelectron hold unit in only the first transfer period or both the storage period and the first transfer period, and configured to turn off the first transfer unit to not transfer the photoelectrons to the photoelectron hold unit in a period other than the first transfer period or other than the first transfer period and the storage period.

4. The solid-state image sensing device according to claim 1, wherein the pixel drive circuits are configured to apply the second voltage, the third voltage, and the first voltage directly to the photogate in this order to discharge the photoelectrons remaining in the photoelectric conversion element in a pre-discharge period after the discharge period and before the storage period.

5. The solid-state image sensing device according to claim 1, wherein the pixel drive circuits contain a first switch for applying the first voltage directly to the photogate, a second switch for applying the second voltage directly to the photogate, and a third switch for applying the third voltage directly to the photogate, and the photoelectrons generated in the photoelectric conversion element are discharged, stored, transferred, or held by controlling the on/off states of the first switch, the second switch, and the third switch.

6. The solid-state image sensing device according to claim 5, wherein the first switch has a plurality of MOS transistors connected in parallel, and the pixel drive circuits are configured to select the number of the MOS transistors to be turned on, whereby a resistance value of the first switch is changed to control a time required to change the voltage applied directly on the photogate from the third voltage or the second voltage to the first voltage.

7. The solid-state image sensing device according to claim 6, wherein the on/off state of at least one of the MOS transistors is configured to be controlled by a logic circuit using a first signal input as an ON/OFF control signal and using a second signal input as a setting signal for changing the resistance value of the first switch.

8. A solid-state image sensing device comprising
a unit pixel containing a photoelectric conversion element for detecting a light to generate photoelectrons, and
a pixel drive circuits for driving the unit pixel,
wherein the photoelectric conversion element has a photogate structure,
the pixel drive circuits are configured to apply a voltage selected from three voltages directly to a photogate of the photoelectric conversion element to store or transfer the photoelectrons,
the three voltages include at least a first voltage, a second voltage higher than the first voltage, and a third voltage higher than the first voltage and lower than the second voltage,
the pixel drive circuits contain a first switch for applying the first voltage directly to the photogate, a second switch for applying the second voltage directly to the photogate, and a third switch for applying the third voltage directly to the photogate, and
the photoelectrons generated in the photoelectric conversion element are discharged, stored, transferred, or held by controlling the on/off states of the first switch, the second switch, and the third switch.

* * * * *